(12) United States Patent
Chiba et al.

(10) Patent No.: US 9,006,111 B2
(45) Date of Patent: Apr. 14, 2015

(54) PATTERN FORMING METHOD

(71) Applicants: Tsuyoshi Chiba, Tokyo (JP); Yusuke Kawano, Tokyo (JP); Yuki Aritsuka, Tokyo (JP)

(72) Inventors: Tsuyoshi Chiba, Tokyo (JP); Yusuke Kawano, Tokyo (JP); Yuki Aritsuka, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 13/628,401

(22) Filed: Sep. 27, 2012

(65) Prior Publication Data

US 2013/0078813 A1    Mar. 28, 2013

(30) Foreign Application Priority Data

Sep. 28, 2011  (JP) ................................. 2011-212682
Sep. 12, 2012  (JP) ................................. 2012-200315

(51) Int. Cl.
*H01L 21/302* (2006.01)
*H01L 21/033* (2006.01)
*H01L 21/308* (2006.01)

(52) U.S. Cl.
CPC ........ *H01L 21/0338* (2013.01); *H01L 21/0337* (2013.01); *H01L 21/3086* (2013.01)

(58) Field of Classification Search
None
See application file for complete search history.

(56) References Cited

U.S. PATENT DOCUMENTS

2010/0248134 A1 *  9/2010  Kim et al. .................. 430/270.1

FOREIGN PATENT DOCUMENTS

| JP | A-2009-194170 | 8/2009 | |
| JP | 2009-235434 | * 10/2009 | ............... C23F 1/00 |
| JP | A-2009-235434 | 10/2009 | |

* cited by examiner

*Primary Examiner* — Zandra Smith
*Assistant Examiner* — Andre' C Stevenson
(74) *Attorney, Agent, or Firm* — Oliff PLC

(57) ABSTRACT

A pattern-formation process including: providing a substrate material having on a major surface a difficult-to-access recess formed by a 1st mask; depositing a 2nd mask having a higher etching resistance than the 1st mask by physical evaporation on the upper surface of the 1st mask and peripherally on a side of the recess, the second mask forming a series of films; and etching the substrate material via the 1st and 2nd mask, wherein forming the 2nd mask includes depositing the 2nd mask material by physical evaporation vertically onto the major surface of the substrate material; and the recess is sized such that, upon deposition, the 2nd mask material cannot substantially reach the bottom of the recess. Accordingly, portions of the recesses formed by the etching masks can be processed by etching even when those recesses are 25 nm or less, and especially 20 nm or less in size.

13 Claims, 12 Drawing Sheets

PATTERN FORMING METHOD

BACKGROUND OF THE INVENTION

1. Field of the Invention

The present invention relates to a pattern-formation process that makes sure formation and processing of a recess-and-projection (or concavoconvex) pattern to be desired—which becomes ever finer—even when the processing sizes or dimensions of recesses are 25 nm or less, especially 20 nm or less. The inventive pattern-formation process may typically find applications for the production of electronic parts with semiconductor integrated circuits built in them and high-density recording media.

2. Description of the Prior Art

Semiconductor integrated circuits are now experiencing ever finer size and ever higher integration, and a variety of photolithography techniques have been developed and studied as a pattern-formation technology for achieving such photolithographic processing. In recent years, attention has also been directed to an imprint method, and the technology for the self-organization of block copolymers as a pattern-formation technology able to be used instead of a variety of photolithography techniques.

With all of those technologies, however, the finer the processing pattern to be demanded, the poorer the etching mask resistance becomes under the influences of side etching or the like, often rendering the etching of substrates more difficult. In particular, such a problem tends to become more noticeable where the recess-and-projection pattern size is 40 nm or less in terms of pitch (the recess size is typically 25 nm or less, especially 20 nm or less).

That is to say, when a recess-and-projection resin pattern of about 40 nm in pitch is formed by an imprint method using an imprint mold as an example and that resin is used as an etching mask to etch a workpiece, there is a problem that the etching mask disappears before the workpiece is processed down to the desired depth, because of the poor resistance of that etching mask.

On the other hand, there is a pattern layer formed by a phase separation in which a phase resistant to etching and a phase less resistant to etching separate through, for instance, the self-organization of a block copolymer, thereby permitting it to have a nano-recess-and-projection pattern of about 40 nm in pitch. When the workpiece is etched while leaving the pattern layer resistant to etching as a mask, too, a similar problem arises.

To provide a solution to those problems, there have been various approaches tried in which the selective ratio is brought up by improvements in etching conditions, the resistance to etching of etching masks such as resists is boosted up, process flows such as introduction of hard masks are varied, and so on; however, all of them would be still less than satisfactory in terms of their effect.

It is to be noted that the prior arts appearing to be relevant to the present invention include Patent Publication 1 (JP(A) 2009-194170) and Patent Publication 2 (JP(A) 2009-235434).

Patent Publication 1 (JP(A) 2009-194170) discloses a technique in which a nano-size $SiO_2$ mask pattern is formed on a substrate by a room-temperature nano-imprint method, and a metal film is deposited by an oblique evaporation method on the outermost surfaces of projections in the micro- or nano-pattern in such a way as to keep the line width precision of the pattern from going down as $SiO_2$ imprint residues adjacent to the mask pattern are removed by RIE. However, the metal film formed on the uppermost surfaces of projections in Patent Publication 1 offers protection against the $SiO_2$ mask pattern as the $SiO_2$ imprint residues are removed, and is different from any film for improving the resistance of the etching mask for pattern-formation purposes in that it does no longer exist upon formation of the micro- or nano-pattern on the substrate. Patent Publication 1 also teaches that the metal film is formed on the uppermost surfaces of projections by the oblique evaporation method, but a problem with the process set forth there is that it has limited use only for the recess-and-projection pattern having some certain regularity all over the surface of the substrate, because evaporated matter would otherwise be deposited up in the recesses.

On the other hand, Patent Publication 2 (JP(A) 2009-235434) discloses a technique in which a structure having a fine recess-and-projection pattern is located with its fine recess-and-projection pattern side opposed to and directed toward a vacuum evaporation source, the structure is then subjected to vacuum oblique evaporation while it is titled at only a given angle with the vacuum evaporation source such that a part of the recess of the fine recess-and-projection pattern is evaporated, thereby depositing and locating an etching mask on the fine recess-and-projection pattern of the structure, and finally etching is carried out to form a recess-and-projection pattern that is much finer than the first-mentioned fine recess-and-projection pattern. When the technique of Patent Publication 2 is used to actively deposit and locate the etching mask on a part of the recess in the fine recess-and-projection pattern, however, it would be difficult to stability the delimiting position of the mask deposited up in the recess; so it would be very difficult to control the pattern precision. Another problem with Patent Publication 2 is that it may find limited application only for a recess-and-projection pattern having some certain regularity all over the surface of the substrate, as is the case with Patent Publication 1.

Having been made with such situations in mind, the present invention has for its object to provide a pattern-formation process that contributes a lot more to improvements in the resistance of an etching mask, and enables recesses formed by the presence of the etching mask in a site to be etched to be processed by etching even when those recesses are 25 nm or less, and especially 20 nm or less in size.

SUMMARY OF THE INVENTION

According to the present invention, the aforesaid object is accomplished by a pattern-formation process comprising a step of providing a substrate material having on a major surface a difficult-to-access recess formed by the presence of a $1^{st}$ mask, a step of using a physical evaporation method to deposit a $2^{nd}$ mask-formation material, which is higher than said $1^{st}$ mask in terms of etching resistance, all over an upper surface of said $1^{st}$ mask and peripherally on a side of said difficult-to-access recess to form a $2^{nd}$ mask comprising a series of films, and a step of etching said substrate material via said $1^{st}$ mask and said $2^{nd}$ mask, wherein said $2^{nd}$ mask-formation step comprises operation of flying said $2^{nd}$ mask-formation material by the physical evaporation method vertically to the major surface of said substrate material, and said difficult-to-access recess is sized such that when said $2^{nd}$ mask-formation material is flown and deposited by the physical evaporation method vertically to the major surface of said substrate material, said $2^{nd}$ mask-formation material cannot substantially reach down to the bottom of said difficult-to-access recess.

In a preferable embodiment of the invention, said difficult-to-access recess has a size of 25 nm or less.

In a preferable embodiment of the invention, said difficult-to-access recess has a size of 6 to 20 nm.

In a preferable embodiment of the invention, said $2^{nd}$ mask-formation material is a metal or a semiconductor, or an oxide or nitride thereof.

In a preferable embodiment of the invention, said $1^{st}$ mask, and said difficult-to-access recess is formed by patterning of a film containing a sequenced polymer by self-organization.

In a preferable embodiment of the invention, said mask and said difficult-to-access recess are formed by patterning using a nanoimprint mold.

In a preferable embodiment of the invention, said step of etching said substrate material is followed by a step of removing said $1^{st}$ mask and said $2^{nd}$ mask.

According to one modification to the pattern-formation process of the invention, there is an easy-to-access recess formed in addition to the difficult-to-access recess in said step of providing a substrate material having on a major surface a difficult-to-access recess formed by the presence of said $1^{st}$ mask; in said $2^{nd}$ mask-formation step, said $2^{nd}$ mask-formation material, which is higher than said $1^{st}$ mask in terms of etching resistance, is deposited all over the upper surface of said $1^{st}$ mask and on the bottom of the easy-to-access recess; the step of etching said substrate material via said $1^{st}$ mask and said $2^{nd}$ mask is carried out via portions of said $1^{st}$ mask and said $2^{nd}$ mask remaining after removal of a bottom deposition layer deposited on the bottom of said easy-to-access recess; the $2^{nd}$ mask-formation step comprises operation of flying and depositing said $2^{nd}$ mask-formation material by the physical evaporation method vertically to the major surface of said substrate material, and said difficult-to-access recess is sized such that when said $2^{nd}$ mask-formation material is flown and deposited by the physical evaporation method vertically to the major surface of said substrate material, said $2^{nd}$ mask-formation material cannot substantially reach down to the bottom of said difficult-to-access recess.

In an embodiment of the aforesaid modification to the pattern-formation process, said easy-to-access recess is sized such that when said $2^{nd}$ mask-formation material is flown and deposited by the physical evaporation method vertically to the major surface of said substrate material, said $2^{nd}$ mask-formation material can substantially reach down to the bottom of said easy-to-access recess.

In another modification to the pattern-formation process of the invention, pre-steps: a step of providing a substrate material having on a major surface a difficult-to-access recess and an easy-to-access recess formed by the presence of a $1^{st}$ mask, a step of sealing the difficult-to-access recess up with a sealing material and a step of etching said substrate material via said $1^{st}$ mask are carried out, after which such inventive steps as recited above are implemented. In said step of providing a substrate material having on a major surface a difficult-to-access recess formed by the presence of said $1^{st}$ mask, there is an easy-to-access recess formed in addition to the difficult-to-access recess; in the $2^{nd}$ mask-formation step, a $2^{nd}$ mask-formation material, which is higher than said $1^{st}$ mask in terms of etching resistance, is deposited all over the upper surface of said $1^{st}$ mask and on the bottom of the easy-to-access recess, said $2^{nd}$ mask-formation step comprises operation of flying and depositing said $2^{nd}$ mask-formation material by the physical evaporation method vertically to the major surface of said substrate material; and said difficult-to-access recess is sized such that when said $2^{nd}$ mask-formation material is flown and deposited by the physical evaporation method vertically to the major surface of said substrate material, said $2^{nd}$ mask-formation material cannot substantially reach down to the bottom of said difficult-to-access recess.

In yet another modification to the aforesaid pattern-formation process, said easy-to-access recess is sized is such that when said $2^{nd}$ mask-formation material is flown and deposited by the physical evaporation method vertically to said major surface of said substrate material, said $2^{nd}$ mask-formation material can substantially reach down to the bottom of said easy-to-access recess.

In a preferable embodiment of the aforesaid yet another modification to the pattern-formation process, the difficult-to-access recess and easy-to-access recess formed by the presence of said $1^{st}$ mask and the difficult-to-access recess and easy-to-access recess formed by the presence of said $1^{st}$ mask should each be formed by patterning using the same nanoimprint mold.

In a preferable embodiment of a further modification of the aforesaid pattern-formation process, said sealing material should be formed of the same material as the $1^{st}$ mask material.

With the inventive pattern-formation process comprising a step of providing a substrate material having on a major surface a difficult-to-access recess formed by the presence of a $1^{st}$ mask, a step of using a physical evaporation method to deposit a $2^{nd}$ mask-formation material, which is higher than said $1^{st}$ mask in terms of etching resistance, from the $1^{st}$ mask side all over the upper surface of said $1^{st}$ mask and peripherally on a side of said difficult-to-access recess to form the $2^{nd}$ mask comprising a series of films, and a step of etching said substrate material via said $1^{st}$ mask and said $2^{nd}$ mask, wherein said $2^{nd}$ mask-formation step comprises operation of flying said $2^{nd}$ mask-formation material by the physical evaporation method vertically to the major surface of said substrate material, and said difficult-to-access recess is sized such that when said $2^{nd}$ mask-formation material is flown and deposited by the physical evaporation method vertically to the major surface of said substrate material, said $2^{nd}$ mask-formation material cannot substantially reach down to the bottom of said difficult-to-access recess, it is possible to improve the resistance of the etching masks, so that portions of the difficult-to-access recesses formed by the presence of the etching masks in a site to be etched can be processed by etching even when those recesses are 25 nm or less, and especially 20 nm or less in size.

DETAILED EXPLANATION OF THE INVENTION

Figure 1A:
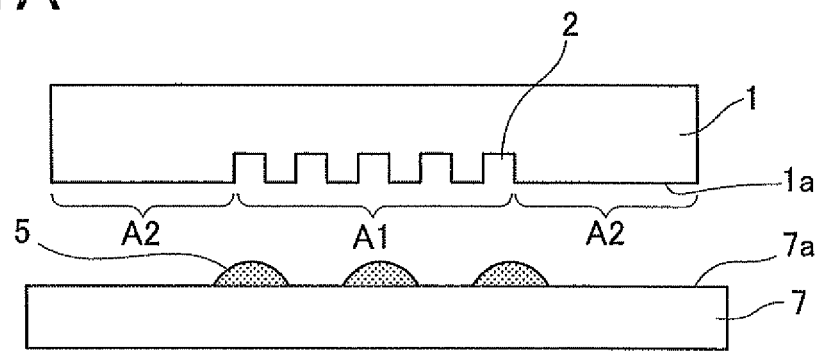
FIGS. 1A, 1B and 1C are illustrative in schematic section and over time of one embodiment of the inventive pattern-formation process using an imprint method, in which there are only difficult-to-access recesses present.

Embodiments for carrying out the invention will now be explained in details with reference to the accompanying drawing.

It is to be noted that the invention is in no sense limited to such specific forms as described below: it may be embodied in various ways without departing from the technical ideas as embraced herein. In the drawings attached hereto, there are horizontally and vertically scaled-up or scaled-down exaggerations provided so as to make illustrations more clearly visible or, in another parlance, there are illustrations provided that are different from those on practical scales.

Being a process for etching the surface of a substrate material to form a recess-and-projection pattern, the pattern-formation process of the invention comprises a step of providing a substrate material having a difficult-to-access recess formed by the presence of the 1$^{st}$ mask, a step of using a physical evaporation method to deposit the 2$^{nd}$ mask-formation material, which is higher than the 1$^{st}$ mask in terms of etching resistance, from the 1$^{st}$ mask side all over the upper surface of the 1$^{st}$ mask and peripherally on the side of the difficult-to-access recess thereby forming the 2$^{nd}$ mask comprising a series of films, and a step of etching the substrate material via the 1$^{st}$ mask and the 2$^{nd}$ mask.

In the invention comprising such steps, the 2$^{nd}$ mask-formation step comprises operation of flying and depositing the 2$^{nd}$ mask-formation material by the physical evaporation method vertically to the major surface of the substrate material, and the aforesaid recess is sized such that when the 2$^{nd}$ mask-formation material is flown and deposited by the physical evaporation method vertically to the major surface of the substrate material, it cannot substantially reach down to the bottom of said difficult-to-access recess. It is to be noted that in two embodiments as described just below, the recesses are all in difficult-to-access form.

In what follows, the steps will each be explained in details.

In the step of providing a substrate material having a recess formed by the presence of the 1$^{st}$ mask, the formation of the 1$^{st}$ mask and the incidental formation of the difficult-to-access recess should preferably be implemented by a nanoimprint method using a so-called nanoimprint mold, a self-organization method of block copolymers or polymer blends, and so on. While the invention is now explained with the former as the first embodiment and the latter as the second embodiment, it is to be understood that the invention is not limited to them, so use may also be made of EB lithography, and photolithography.

First Embodiment

Step of Providing a Substrate Material Having a Recess Formed by the Presence of the 1$^{st}$ Mask In the first embodiment, there is the step implemented of providing a substrate material having the 1$^{st}$ mask and recesses formed by the presence of the 1$^{st}$ mask using the nanoimprint method.

The nanoimprint method known so far in the art, for instance, includes photo- or thermal-nanoimprint methods. Taking the photonanoimprint method as an example, this embodiment is now explained.

In the photonanoimprint method, a photocurable resin material 5 as the workpiece to be transferred is fed to and located on the surface 7a of a substrate material (often called the substrate) 7 for nanoimprinting, as shown typically in FIG. 1A. The resin material 5 may be fed in an appropriate mode such as a dispenser or inkjet mode. While a few droplets of the resin material 5 are shown, it is to be understood that how many droplets of the resin material 5 are used, where they are dropped and so on may be optional, and the respective droplets may vary in amount as well. Alternatively, spin coating or the like may be applied to coat the photocurable resin material 5 on the surface 7a of the substrate material 7 as a uniform film or, otherwise, the resin material may be located on the side of a mold 1 rather than on the side of the substrate 7.

The substrate 7 for imprinting, for instance, may be formed of a glass such as quartz, soda lime glass and borosilicate glass, a semiconductor such as silicon, gallium arsenide and gallium nitride, a resin substrate such as a polycarbonate, polypropylene and polyethylene substrate, and a metal substrate or a composite material substrate composed of two or more of these materials.

The substrate material 7 is not necessarily in flat form, so it may have a given structure formed in advance. For instance, the substrate material 7 may have a desired pattern structure such as fine wiring used with semiconductors, displays or the like, a photonic crystal structure, a photoguide, and a holographic or other optical structure. However, it is to be noted that the mold 1 must be configured such that such a structure does not stand in the way upon transfer, or it must be located in such a position as not to interfere with the recess-and-projection structure the mold 1 has. For instance, the transfer method used may be modified or varied such that a given material is filled up in the recesses in the pattern to make it flat.

As depicted in FIG. 1A, the mold 1 is located and provided in opposition to the substrate material 7 for imprinting. The surface 1a of the mold 1 is built up of a recess-and-projection structure area A1 having recesses 2 that form the structure to be transferred, and a plain area A2 having no recess-and-projection structure to be transferred. While the structure to be transferred is illustrated as being concave with respect to the plain area A2, it is to be understood that the structure to be transferred may be of either convex or concavoconvex shape.

The mold 1 may be formed of any suitable material; however, when the resin material 5 is photocurable, the mold 1 may be formed of a substrate material transparent to curing light to cure the resin material 5. For instance, there is the mention of glasses such as quartz glass, borate glass, calcium fluoride, magnesium fluoride and acrylic glass, resins such as polycarbonate, polypropylene and polyethylene, or any desired laminate thereof. However, it is to be noted that when the substrate material 7 is transparent to the curing light, the mold 1 is not necessarily formed of a transparent material; so it may be formed of a metal such as nickel, titanium and aluminum, or a semiconductor such as silicon and gallium nitride.

The mold 1 may have a thickness determined while taking the shape of the recess-and-projection structure, the strength of the substrate material, handleability, etc. in consideration, and that thickness may optionally be selected from a range of typically about 300 μm to about 10 mm. The mold 1 may also have a so-called mesa structure in which the whole recess-and-projection structure area A1 is convex with respect to the plain area A2. Two or more such mesa structures may be used, to say nothing of one such mesa structure.

Figure 1B:
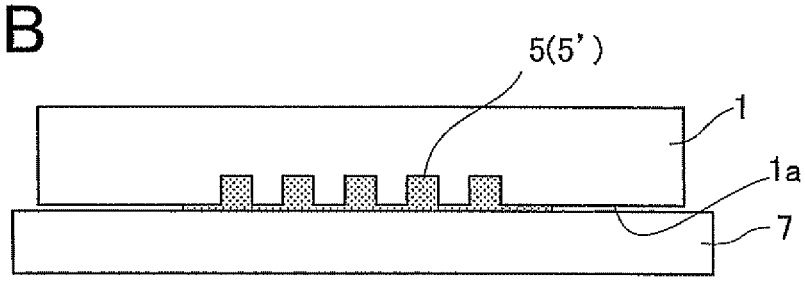

Then, as depicted in FIG. 1B, the located resin material 5 is brought in contact with the surface 1a of the mold 1 having the desired recess-and-projection structure. The resin material 5 to be transferred is filled up in the recess-and-projection structure of the mold 1 by the capillary phenomenon, although depending on the viscosity of the resin material 5. If required, the mold 1 or the substrate material 7 may be forced upon the opposite surface side to help fill the resin material 5 up in the recess-and-projection structure. In this state of contact of the mold 1 with the substrate material 7 via the resin material 5, the resin material 5 turns into a resin layer having the recess-and-projection structure, and as that resin layer is irradiated with ultraviolet radiation, it causes the resin material 5 to be cured (the so-called resin curing step).

Figure 1C:
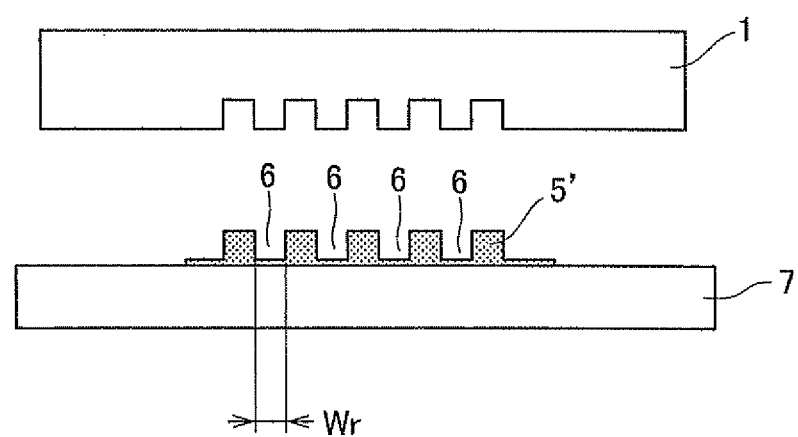

Thereafter, as depicted in FIG. 1C, the peeling step is implemented to apply peeling force in such a way as to widen the spacing distance between the substrate material 7 for imprinting and the mold 1, thereby pulling the mold 1 off a resin layer 5'. Upon pulling operation, pulling force may be applied from either the mold 1 side or the substrate material 7 side or from both.

When the pulling force is applied to the mold 1 side, the force may be applied uniformly to the resin layer 5'; however, it is preferable that uneven force is applied to the resin layer 5' for easier pulling, because the application of uneven force to the resin layer 5' allows for the creation of a peeling start point from which smooth peeling takes place.

By pulling the mold 1 off the resin layer 5', the resin layer 5' having a recess-and-projection structure that is a reversal of the recess-and-projection structure the mold 1 has is transferred onto the substrate material 7 for imprinting. It is to be noted that all of the resin material 5 is not entirely received in the recesses in the mold 1 upon forcing of the mold depicted in FIG. 1B, so the remainder is left on the surface 7a of the substrate material 7 in the form of a residual film (or residue).

Thus, there is the step finished of providing a substrate material having a $1^{st}$ mask and a difficult-to-access recess formed by the presence of the $1^{st}$ mask as depicted in FIG. 1C. The resin layer 5' having a projection structure is corresponding to the $1^{st}$ mask, and a difficult-to-access recess 6 is formed by the presence of the resin layer 5' having a projection structure (the $1^{st}$ mask). While the step of providing a substrate material having a $1^{st}$ mask 5' and a difficult-to-access recess 6 formed by the presence of the $1^{st}$ mask 5' may be completed by removal of the residual film, it is to be understood that removal of the residual film should preferably be implemented after the formation of the $2^{nd}$ mask to be described later, because removal of the residual film at this point has action on a decrease in the height of the $1^{st}$ mask.

Figure 2A:
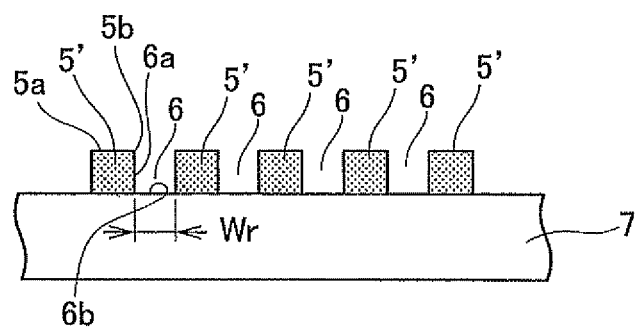
FIGS. 2A, 2B, 2C and 2D are illustrative in schematic section and over time of one embodiment of the inventive pattern-formation process to be carried out following FIG. 1, in which there are only difficult-to-access recesses present.

It is to be noted that FIG. 2A shows how the resin layer 5' (inclusive of the residual film) is being formed on the substrate material 7 as is the case with the resin layer 5' (inclusive of the residual film) formed on the substrate material 7 in FIG. 1C. However, it is to be noted that the residual film is left out in FIG. 2A for an easy understanding of the essential part of the invention to be described later.

In the invention, the size determination for the aforesaid difficult-to-access recess 6 is of great importance, and the size Wr of the difficult-to-access recess 6 is determined such that when the aforesaid $2^{nd}$ mask-formation material is flown and deposited by the physical evaporation method vertically to the major surface of the substrate material 7, it cannot substantially reach down to the bottom of the difficult-to-access recess 6. The "not substantially reach" referred to herein implies that in the processing by dry etching of the bottom of the difficult-to-access recess 6 in a later step, the bottom of the difficult-to-access recess 6 being capable of being clearly processed is allowable as a level for not substantially reaching. More specifically, even if the $2^{nd}$ mask-formation material is dispersed on the bottom of the difficult-to-access recess 6 in an islands form or even if it is formed on the bottom of the difficult-to-access recess 6 in a single thin-film form, to say nothing of when there is none of the $2^{nd}$ mask-formation material present on the bottom of the difficult-to-access recess 6 at all, the bottom of the difficult-to-access recess 6 being capable of being clearly processed by dry etching in a later step is allowable as the level for not substantially reaching.

The size Wr of the difficult-to-access recess 6 may be determined on a major premise that film-formation be implemented vertically to the major surface of the substrate material; however, this may be affected by the size of flying film-formation particles, the height-to-width aspect ratio of the difficult-to-access recess 6, etc. For instance, as flying film-formation particles grow large in size, it causes the allowable size Wr of the difficult-to-access recess 6 to tend to increase a bit, if not large. As the aspect ratio grows high, it again causes the allowable size Wr of the difficult-to-access recess 6 to tend to increase a bit, if not large. Even given the physical evaporation method, the allowable size Wr of the difficult-to-access recess 6 tends to differ depending on the film-formation method used, for instance, depending on whether it is a sputtering method or a vacuum evaporation method. The sputtering method is more unlikely to form a film in the difficult-to-access recess 6 in the fine pattern than the vacuum evaporation method, and the allowable size Wr of the difficult-to-access recess 6 tends to increase a bit, if not large. This is because in the sputtering method, atoms are more scattered upon flying due to the impact of ions on a target, and collisions with residual gases, resulting in an increased diffraction to the pattern. From this point of view, it is preferable to use the sputtering method in the invention.

Referring here to a specific numeral level for the size Wr that keeps flying film-formation particles from reaching down to the bottom of the difficult-to-access recess 6, Wr should be 25 nm or less, especially 20 nm or less, preferably 6 to 20 nm, and more preferably 6 to 15 nm.

In what follows, how to determine the size Wr of the difficult-to-access recess 6 depending on the pattern embodiment of the difficult-to-access recess 6 formed by the presence of the $1^{st}$ mask 5' will now be considered.

For instance, the pattern of the difficult-to-access recesses 6 formed by the presence of the $1^{st}$ mask 5' may be broken down into three types: (1) an array of holes closely packed and located in given positions or an isolated hole consisting of a single hole, (2) a plurality of recesses, each in an elongate groove shape, arranged at a constant pitch as a so-called line-and-space or an isolated groove consisting of a single elongate groove-like recess, and (3) a recess pattern formed by an array of so-called projection-structure pillars closely packed and located, among which Embodiments (2) and (3) are particularly preferable for the invention. This is because the invention can be applied to such specific embodiments with greater advantages due to the facts that the area exposed to etchants is larger, and the etching resistance of the fine pattern is lower from the outset.

In Embodiment (1) having a hole or holes, it is a principle to select as Wr the maximum diameter out of those of circles capable of being inscribed in the hole or holes as viewed on plane. For instance in an embodiment having a circular hole as viewed on plane, the diameter of that circle may be selected as the size Wr of the difficult-to-access recess 6; in an embodiment having an oval hole as viewed on plane, the length of the minor axis may be selected as the size Wr of the difficult-to-access recess 6; and in an embodiment having a regular or amorphous polygonal hole or holes as viewed on plane, the maximum diameter out of those of circles capable of being inscribed in the hole or holes as viewed on plane may be selected as Wr. Likewise, in an embodiment having a sheer amorphous hole or holes as viewed on plane, the maximum diameter out of those of circles capable of being inscribed in the hole or holes as viewed on plane may be selected as Wr. When there are multiple holes of varying sizes, the Wr having the maximum value may be set as the size Wr of the difficult-to-access recess 6.

In Embodiment (2) having an elongate groove space, the width of the groove (in the direction at right angles with its lengthwise direction) may be determined as the size Wr of the difficult-to-access recess 6. This is also based on the aforesaid principle that the maximum diameter out of those of circles capable of being inscribed in the hole is selected as Wr, as is the case with Embodiment (1) having a hole or holes.

In Embodiment (3) having a recess pattern resulting from an array of close-packed pillars, the diameter d of a circle having the maximum diameter out of circles capable of being circumscribed on the side of a projection pattern comprising a plurality of pillars as viewed on plane is in principle determined as the size Wr of the difficult-to-access recess 6.

This is further explained taking (A) a tetragonal lattice arrangement (arrayed at a square pitch) having regularity and (B) a closest-packed arrangement (arrayed at a regular triangular pitch) as examples.

Figure 3:
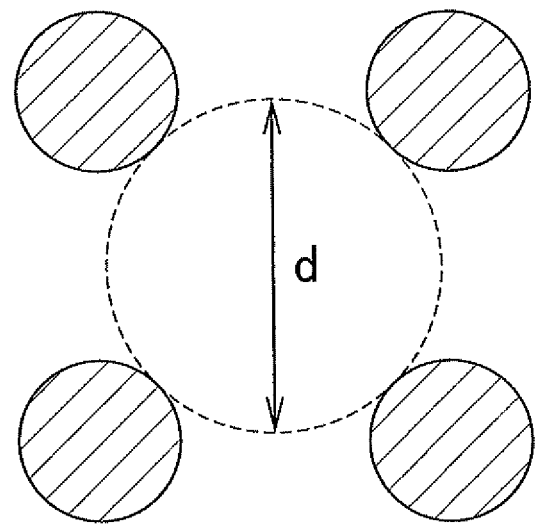
FIG. 3 is a plan view of cylindrical pillars positioned in a square pitch array.

FIG. 3 is illustrative of a tetragonal lattice arrangement in which a plurality of cylindrical pillars are arrayed at a square pitch; more specifically, it is a plan view in which four adjacent cylindrical pillars are selectively shown for convenience of illustration. In this case, the diameter d of a circle located in such a way as to be circumscribed on the side of a projection pattern comprising a plurality of pillars may be determined as the size Wr of the difficult-to-access recess 6 on the basis of the aforesaid principle. When it comes to a tetragonal lattice arrangement (arrayed at a square pitch), the diameter d of the circle illustrated is in principle the same wherever it is measured, corresponding to the maximum diameter.

Figure 4:
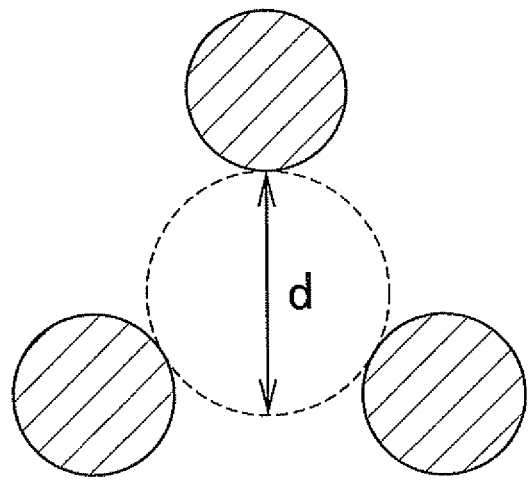
FIG. 4 is a plan view of cylindrical pillars positioned in a regular triangle pitch array.

FIG. 4 is illustrative of cylindrical pillars provided in a closest-packed arrangement (arrayed at a regular rectangular pitch); more specifically, it is a plan view in which three adjacent cylindrical pillars are selectively shown for convenience of illustration. In this case, the diameter d of a circle located in such a way as to be circumscribed on the side of a projection pattern comprising a plurality of pillars may be determined as the size Wr of the difficult-to-access recess 6 on the basis of the aforesaid principle. When it comes to a closest-packed arrangement (arrayed at a regular triangular pitch), the diameter d of the circle illustrated is in principle the same wherever it is measured, corresponding to the maximum diameter.

Figure 5:
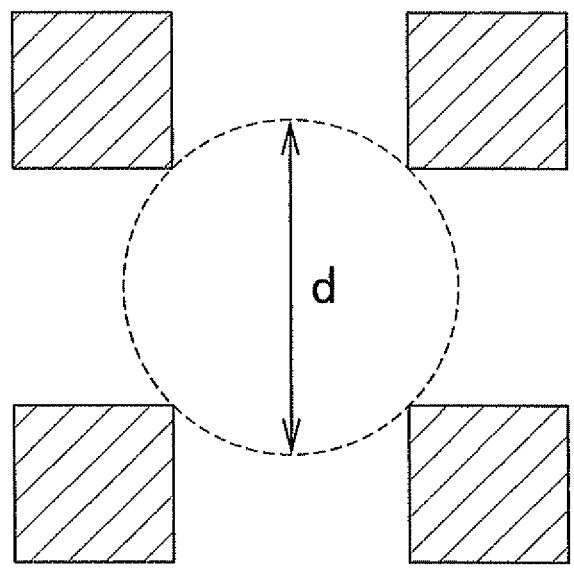
FIG. 5 is a plan view of regular quadrangular prisms positioned in a square pitch array.

FIG. 5 is illustrative of a plurality of regular quadrangular pillars arranged in a tetragonal lattice arrangement (arrayed at a square pitch); more specifically, it is a plan view in which four adjacent regular quadrangular pillars are selectively shown for convenience of illustration. In this case, the diameter d of a circle located in such a way as to be circumscribed on the side of a projection pattern comprising a plurality of pillars may be determined as the size Wr of the difficult-to-access recess 6 on the basis of the aforesaid principle. When it comes to a tetragonal lattice arrangement (arrayed at a square pitch), the diameter d of the circle illustrated is in principle the same wherever it is measured, corresponding to the maximum diameter.

Figure 6:
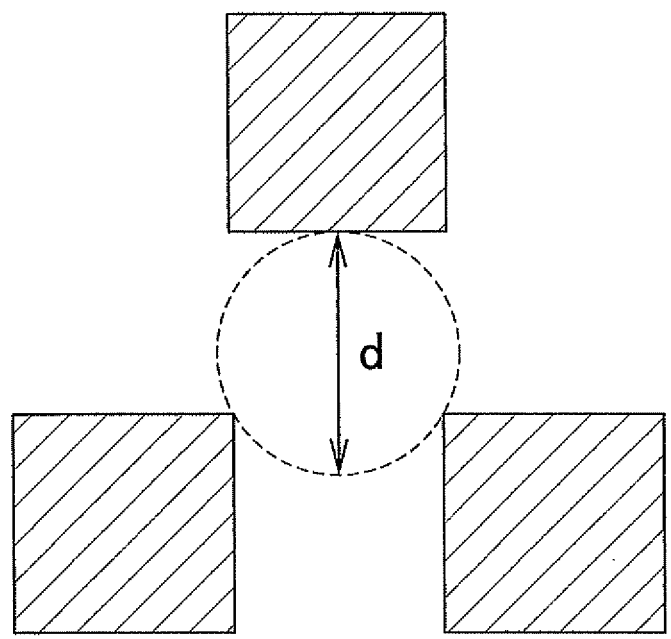
FIG. 6 is a plan view of regular quadrangular prisms positioned in a regular triangle pitch array.

FIG. 6 is illustrative of a plurality of regular quadrangular pillars arranged in a closest-packed arrangement (arrayed at a regular triangular pitch); more specifically, it is a plan view in which three adjacent regular quadrangular pillars are selectively shown for convenience of illustration. In this case, the diameter d of a circle located in such a way as to be circumscribed on the side of a projection pattern comprising a plurality of pillars may be determined as the size Wr of the difficult-to-access recess 6 on the basis of the aforesaid principle. When it comes to a closest-packed arrangement (arrayed at a regular triangular pitch), the diameter d of the circle illustrated is in principle the same wherever it is measured, corresponding to the maximum diameter.

In the foregoing specific explanation, reference is made to exemplary arrangements having regularity; even in an irregular (random) arrangement having none of regularity, however, the size Wr of the difficult-to-access recess 6 may be found according to the aforesaid principle. That is, the diameter d of a circle having the maximum diameter out of circles located in such a way as to be circumscribed on the side of a projection pattern comprising a plurality of pillars as viewed on plane may be determined as the size Wr of the difficult-to-access recess 6. Likewise, even when the regular quadrangular or cylindrical pillars are modified to other pillars of constant or amorphous shape as viewed on plane, the size Wr of the difficult-to-access recess 6 may be figured out according to the aforesaid principle.

The production process of the invention is further explained with reference to FIGS. 2A, 2B, 2C and 2D.

Figure 2B:
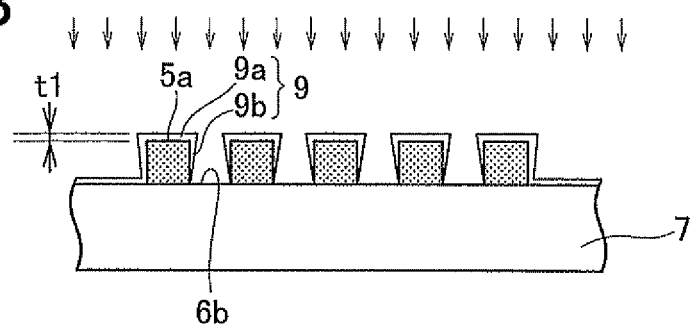

Step of Forming the $2^{nd}$ Mask all Over the Upper Surface of the $1^{st}$ Mask and Peripherally on the Side of the Aforesaid Recess As depicted in FIG. 2B, there is the operation implemented of depositing the $2^{nd}$ mask-formation material that is higher than the $1^{st}$ mask 5' in terms of etching resistance all over the upper surface of the $1^{st}$ mask and peripherally on the side 6a of the aforesaid difficult-to-access recess 6 thereby forming the $2^{nd}$ mask 9 comprising a series of films.

It is to be noted that the term "peripherally" means that the $2^{nd}$ mask-formation material is located just around the side 6a of the difficult-to-access recess 6. To add to this, it means that as viewed on plane in a given position of the $1^{st}$ mask, the $2^{nd}$ mask is providing covering in such a way as to surround the entire side of the difficult-to-access recess 6.

In the instant embodiment wherein the projection shape of the $1^{st}$ mask 5' is of relatively visible rectangular shape in section, it is the "upper surface" that corresponds to a substantially flat top 5a of the convex $1^{st}$ mask 5'. Likewise, it is the side 6a of the difficult-to-access recess 6 that corresponds to the surface 6a of the convex $1^{st}$ mask 5' that depends down from a peripheral edge 5b of the substantially flat top. A portion of the $2^{nd}$ mask 9 formed on the upper surface 5a of the $1^{st}$ mask 5' is called an upper portion 9a of the $2^{nd}$ mask, and a portion of the $2^{nd}$ mask 9 formed on the side 6a of the difficult-to-access recess 6 corresponding to the side of the $1^{st}$ mask 5' is called a side 9b of the $2^{nd}$ mask.

The upper portion 9a of the $2^{nd}$ mask formed on the substantially flat upper surface (top) 5a of the convex $1^{st}$ mask 5' should have a thickness t1 of typically about 0.5 nm to about 3 nm. If this value is less than, for instance, 0.5 nm, it is then likely that there may be difficulty improving etching resistance by the formation of the $2^{nd}$ mask, and if the thickness is greater than, for instance, 3 nm so much that the film-formation time becomes too long, it is then likely that the difficult-to-access recess may possibly be closed off.

While it is ideal that the $2^{nd}$ mask-formation material is deposited on the top-to-bottom entire side 6a of the difficult-to-access recess 6 to form the side 9b of the $2^{nd}$ mask, it is to be understood that there is no need for going to that far in the invention. In other words, it is needed just only to deposit the $2^{nd}$ mask-formation material on a portion from the upper end 5b of the side 6a of the difficult-to-access recess 6 (the same as the peripheral edge 5b of the substantially flat top 5a of the convex $1^{st}$ mask 5') going down (toward the substrate material 7) to form the side 9b of the $2^{nd}$ mask. Here given the entire area S1 of the side 6a of the difficult-to-access recess 6, the area ratio of the side 9b of the $2^{nd}$ mask deposited on the side 6a of the recess 6 should desirously fall within a range of preferably (0.3 to 1.0) S1, and more preferably (0.5 to 1.0) S1. This is to improve side etching resistance on the side of the $1^{st}$ mask 5'.

It is to be noted that the amount of deposition of the $2^{nd}$ mask-formation material for the side 9b of the $2^{nd}$ mask reaches a maximum at the upper end 5b of the side 6a of the difficult-to-access recess 6, and tends to decrease from there down toward the substrate material 7.

For instance, the 2" mask-formation material is preferably made up of a metal, a metal oxide, a metal nitride, a semiconductor, a semiconductor oxide, or a semiconductor nitride. More specifically, there is the mention of at least one species selected from the group consisting of Cr, Al, Si, Ta, Ti, Ag, Au, Co, Cu, Ni, Pd, Pt, and Mo or a nitride, oxide or the like of the elements in this group. As already mentioned, however, it is necessary for the $2^{nd}$ mask-formation material to be higher than the $1^{st}$ mask 5' in terms of etching resistance; so an appropriate selection may be made while the material of the $1^{st}$ mask 5' and the specific etching method are taken in account.

In this step of the invention, there is the operation implemented of flying and depositing the $2^{nd}$ mask-formation material by the physical evaporation method vertically to the major surface of the substrate material. The term "vertically" to the major surface of the substrate material embraces a tolerance of ±10°, although the tolerance of ±5° is preferred. The physical evaporation method is exemplified by various sputtering methods (conventional sputtering, magnetron sputtering, ion beam sputtering, ECR sputtering or the like) as well as various evaporation methods (vacuum evaporation, molecular beam evaporation, ion plating, ion beam evaporation or the like).

Among others, the sputtering method is most preferable. This is because the sputtering method causes atoms to be more scattered upon flying due to the collisions of ions and residual gases on a target than the vacuum evaporation method, so that diffraction to the pattern grows more, making it less likely to form a film at the bottom of the fine pattern.

In this step of the invention, there is the operation implemented of depositing the $2^{nd}$ mask-formation material all over the upper surface 5a of the $1^{st}$ mask 5' and peripherally on the side 6a of the difficult-to-access recess 6 thereby forming the $2^{nd}$ mask 9 comprising a series of films. In this case, any film comprising the $2^{nd}$ mask-formation material is not substantially formed at the bottom 6b of the difficult-to-access recess 6. This is because, as described above, the size Wr of the difficult-to-access recess 6 is determined such that when the $2^{nd}$ mask-formation material is flown and deposited by the physical evaporation method vertically to the major surface of the substrate material as described later, it cannot substantially reach down to the bottom 6b of the difficult-to-access recess 6. For implementing that step as desired, it is of importance to properly determine the size Wr of the difficult-to-access recess 6, and implement vertical film formation. If required, it is preferable to adjust the film-formation time.

Figure 2C:
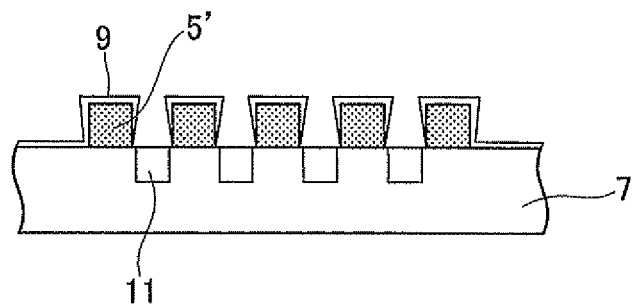

Step of Etching the Substrate Material Via the $1^{st}$ Mask and the Aforesaid $2^{nd}$ Mask Then, as depicted in FIG. 2C, there is the step implemented of etching the substrate material 7 via the $1^{st}$ mask 5' and the $2^{nd}$ mask 9.

That is, while the projection where a thin film comprising the $2^{nd}$ mask 9 is applied onto the $1^{st}$ mask 5' is used as a mask, the difficult-to-access recess 6 is etched whereby a fine recess 11 corresponding to the bottom size of the difficult-to-access recess 6 is formed on the surface of the substrate material 7. It is to be noted that when the $1^{st}$ mask is formed by the nanoimprint method, there is usually a residual film present on the bottom 6b of the difficult-to-access recess 6; so the inventive step of etching the substrate material 7 is preferably implemented after removal of that residual film by oxygen plasma treatment (ashing treatment) or the like.

It is usually desired that the substrate material 7 be etched by dry etching such as reactive gas etching, and reactive ion etching.

For a choice of the etching gas for etching of the substrate material 7, for instance, a combination of etching gas with the substrate material 7 plus the material of the $2^{nd}$ mask 9 having good etching resistance may properly be determined such that there is an increased etching selection ratio achieved. For instance, when the substrate material 7 is quartz, it is preferable to use Cr for the $2^{nd}$ mask material and carbon tetrafluoride ($CF_4$) for the etching gas, and when the substrate material 7 is silicon, it is preferable to use $SiO_2$ for the $2^{nd}$ mask material and hydrogen bromide (HBr) for the etching gas.

Figure 2D:
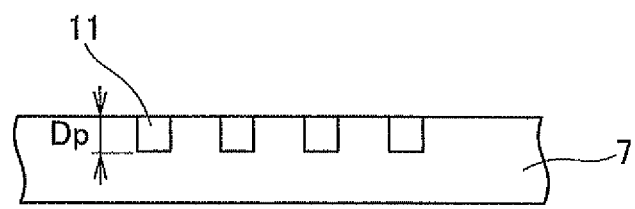

As depicted in FIG. 2D, the depth Dp of the recess 11 in the substrate material 7 capable of being etched is determined by the etching resistance or the like of the $1^{st}$ mask 5' and the $2^{nd}$ mask 9; however, the depth Dp of the recess 11 could be up to about 20 nm as an example, because the $2^{nd}$ mask 9 having good etching resistance is provided in the invention.

Step of Removing the $1^{st}$ Mask and the $2^{nd}$ Mask

After the step of etching the substrate material 7 as described above, there is the step provided of removing the $1^{st}$ mask 5' and the $2^{nd}$ mask 9, ending up with the state depicted in FIG. 2D. It is thus possible to obtain the substrate material 7 having the recesses 11 formed in the desired pattern.

The substrate material 7 having such a desired pattern formed on it, for instance, may be applied to the production of electronic parts equipped with semiconductor integrated circuits or high-density recording media.

Second Embodiment

The second embodiment of the invention is now explained with reference to FIG. 7.

Step of Providing a Substrate Material Having a Recess Formed by the Presence of the $1^{st}$ Mask In the step of providing a substrate material having a recess formed by the presence of the $1^{st}$ mask, a self-organization method of block copolymers, that is, a method that uses a self-organizing phase-separation structure of a block copolymer is used as a method for the formation of the $1^{st}$ mask and the incidental formation of a recess.

In the instant embodiment of the invention, one preferable example of a block copolymer having self-organizing phase-separation action is explained with reference to a polystyrene (PS)-polydimethylsiloxane (PDMS) block copolymer that contains polystyrene (PS) as one organic block and polydimethylsiloxane as one inorganic block. It is to be noted that polydimethyl siloxane (PDMS) has better resistance to, for instance, oxygen plasma than the organic component polystyrene (PS).

Figure 7A:
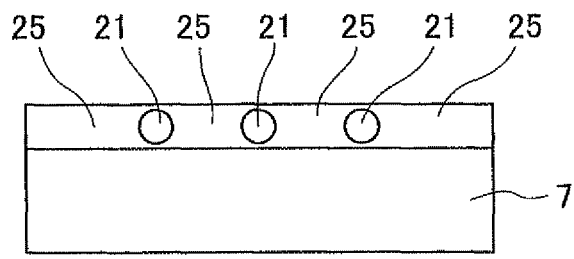
FIGS. 7A, 7B, 7C, 7D and 7E are illustrative in schematic section and over time of one embodiment of the inventive pattern-formation process using a self-organization method of block copolymers.

As a stage prior to the state depicted in FIG. 7A, a composition containing the block copolymer and a solvent for dissolving this component is coated on the substrate material 7 into a composition layer. The composition may be coated by any one of spin coating, dipping, spraying, and any other suitable means.

Then, the composition layer is heated thereby causing self-organization of the block copolymer as shown in FIG. 7A, resulting in the formation of a structure phase-separated into a first polymer phase 21 (PDMS) composed mainly of polydimethylsiloxane configured into a substantially spherical shape and having etching resistance and a second polymer phase 25 (PS) composed mainly of polystyrene (PS) that is lower than the first polymer phase 21 in terms of etching resistance. In the instant embodiment, the first polymer phase 21 having etching resistance is in a substantially spherical shape; however, that is not always limited to such a shape.

In the instant embodiment of the invention, the first polymer phase 21 takes a form of, for instance, a regular arrangement structure arrayed at a given pitch, and usually a form approximate to a hexagonal lattice arrangement that is a closest-packed arrangement (arrayed at a regular rectangular pitch).

Figure 7B:
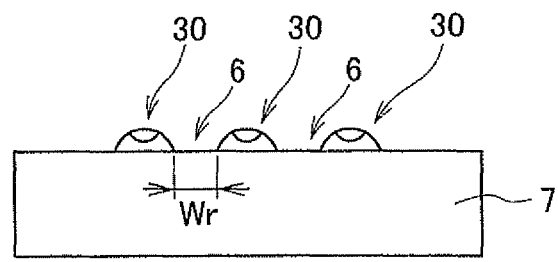

Then, the composition layer separated into two phases on the substrate material 7 is subjected to reactive etching (RIE) such as oxygen plasma etching, whereby the $1^{st}$ mask 30 of bowl shape is formed on the substrate material 7, said mask 30 being patterned with the position where the first polymer phase 21 exists as center. As shown in FIG. 7B, the $1^{st}$ mask 30 is in bowl form in which the first polymer phase 21 composed mainly of polydimethylsiloxane (PDMS) and having etching resistance remains at the top, and the second polymer phase 25 composed mainly of polystyrene (PS) remains below and around it.

And there is the difficult-to-access recess 6 present in a space between adjacent bowl-like $1^{st}$ masks 30.

It is to be noted that for the method for the formation of the projection pattern of the $1^{st}$ mask and the incidental formation of the recess, not only may the aforesaid polystyrene (PS)-polydimethylsiloxane (PDMS) block copolymer be used, but the self-organizing phase-separation structure of other block copolymer may also be used.

For instance, if a composition containing a block copolymer, a silicon compound and a solvent for dissolving these components is coated on the substrate material 7 to form a composition layer that is then heated thereby causing self-organization of the block copolymer, then it may also be possible to form a structure phase-separated into the first polymer phase 21 having the silicon compound localized in it and having etching resistance and the second polymer phase 25 that is lower than the first polymer phase 21 in terms of etching resistance. The silicon compound used herein should preferably have affinity with the first component of the block copolymer and non-affinity with the second component of the block copolymer.

In the alternative, the block copolymer may first be separated into the first polymer phase and the second polymer phase. Then, if fine particles of a silicon compound or the like are selectively adsorbed onto one of these polymer phases, it is then possible to improve the etching resistance of another polymer phase.

There is here a general explanation provided of the self-organization method of the block copolymer.

Used for the block copolymer is a copolymer capable of being self-organized by heating for phase separation, and a preferable example thereof is an A-B type "diblock copolymer" in which two polymer chains A and B are linked together.

By way of example but not by way of limitation, such A-B type diblock copolymers include polystyrene-polydimethylsiloxane, polystyrene-polyisobutene, polystyrene-isoprene, polydimethylsiloxane-polyisobutene, polystyrene-polyethylene oxide, polystyrene-polypropylene oxide, polyethylene oxide-poly(cyanobiphenyloxy)hexyl methacrylate, polystyrene-polymethyl methacrylate, polystyrene-polymethacrylic acid, polyethylene oxide-polyvinylpyridine, polystyrene-polyvinylpyridine, and polyisoprene-polydhyroxystyrene.

Besides, use may also be made of two polymer chains linked together in A-B-A type and "triblock copolymers" in which three polymer chains are linked together in A-B-C type.

For the copolymer in which two polymer chains are linked together in A-B-A type, for instance, there is the mention of a structure in which one component of the aforesaid A-B type diblock copolymer is further linked to the terminus of other component.

The morphology and size of the first polymer phase 21 and second polymer phase 25 forming the regular arrangement structure, for instance, depend on the length (molecular weight), etc. of the polymer chain of each of the blocks forming the block copolymer (A, B, and C), and if these are adjusted, a pattern of fine size may then be formed. Upon phase separation, for instance, spherical shape, lamellar shape or cylindrical shape may be obtained by shape control as desired.

Figure 7C:
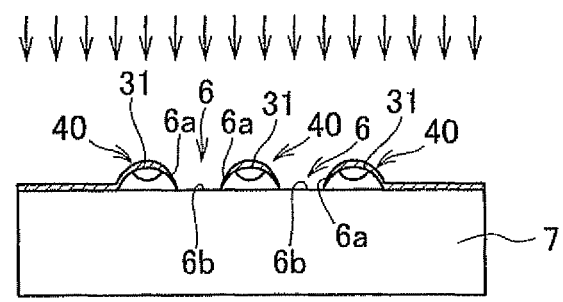

Step of Forming the $2^{nd}$ Mask all Over the Upper Surface of the $1^{st}$ Mask and Peripherally on the Side of the Aforesaid Recess Then, as depicted in FIG. 7C, the $2^{nd}$ mask-formation material that is higher than the $1^{st}$ mask 30 in terms of etching resistance is deposited all over the upper surface of the $1^{st}$ mask 30 and peripherally on the side 6a of the difficult-to-access recess 6 thereby forming the $2^{nd}$ mask comprising a series of films.

Figure 8:
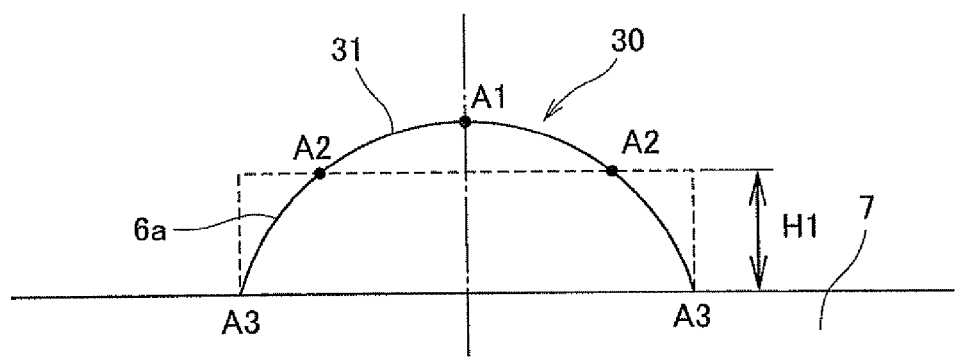
FIG. 8 illustrates the definition of the upper surface of the 1$^{st}$ mask configured into a bowl shape close to a semicircular shape and the side of the difficult-to-access recess.

In the instant embodiment wherein the $1^{st}$ mask is configured in a bowl shape substantially close to a hemisphere, the aforesaid definitions for the upper surface of the $1^{st}$ mask and the side 6a of the difficult-to-access recess 6 in the first embodiment do not hold just the way they are; so the definitions for the upper surface of the $1^{st}$ mask and the side 6a of the difficult-to-access recess 6 are now explained with reference to FIG. 8.

That is, the whole volume of the bowl shape forming the $1^{st}$ mask shown in FIG. 7 is calculated. Presume here that the bottom area (A3-A3 plane) is the same, and consider a surface of the bowl-shaped $1^{st}$ mask intercepted by the upper surface (at a height H1) of a circular cylinder (drawn by a dotted line in FIG. 8) whose volume is the same as the volume of that bowl shape. Then, a surface (A1-A2-A1 plane) positioned on the upper side intercepted is defined as the upper surface 31 of the $1^{st}$ mask 30, and a surface (A2-A3 plane) positioned on the lower side intercepted is defined as the side 6a of the difficult-to-access recess 6.

As depicted in FIG. 7C, the $2^{nd}$ mask 40 formed on the upper surface 31 of the bowl-shaped $1^{st}$ mask 30 defined as mentioned above should have a thickness of, for instance, about 0.5 nm to about 3 nm.

It is to be noted that there is no need for depositing the $2^{nd}$ mask-formation material on the top-to-bottom entire side 6a of the difficult-to-access recess 6 defined as described above to form the side of the $2^{nd}$ mask 40. In other words, it is needed just only to deposit the $2^{nd}$ mask-formation material on a portion from the upper end (indicated by A2 in FIG. 8) of the side 6a going down (toward the substrate material 7) to form the side of the $2^{nd}$ mask 40. Here given the entire area 31 of the side 6a of the difficult-to-access recess 6, the area ratio of the side of the $2^{nd}$ mask deposited on the side 6a of the recess 6 should desirously fall within a range of preferably (0.3 to 1.0) S1, and more preferably (0.5 to 1.0) S1. This is to improve side etching resistance on the side of the $1^{st}$ mask 30.

It is to be noted that the amount of deposition of the $2^{nd}$ mask-formation material on the side 6a of the $2^{nd}$ mask 6 reaches a maximum at the upper end of the side 6a of the difficult-to-access recess 6, and tends to decrease from there down toward the substrate material 7.

Usable for the $2^{nd}$ mask-formation material are such similar materials as explained in the first embodiment of the invention. For the $2^{nd}$ mask-formation material, however, it is necessary to have higher etching resistance than that of the $1^{st}$ mask 30, as previously noted; so it may optionally be selected while taking the material of the $1^{st}$ mask 30 and the specific etching method used into consideration.

In this step of the invention, there is the operation implemented of flying and depositing the $2^{nd}$ mask-formation material by the physical evaporation method vertically to the major surface of the substrate material 7, as is the case with the first embodiment of the invention.

In this step of the invention, there is the operation implemented of depositing the $2^{nd}$ mask-formation material all over the upper surface 31 of the $1^{st}$ mask 30 and peripherally on the side 6a of the difficult-to-access recess 6 thereby forming the $2^{nd}$ mask 40 comprising a series of films. In this case, any film comprising the $2^{nd}$ mask-formation material is not formed at the bottom 6b of the difficult-to-access recess 6. This is because, as described above, the size Wr of the difficult-to-access recess 6 is determined such that when the $2^{nd}$ mask-formation material is flown and deposited by the physical evaporation method vertically to the major surface of the substrate material as described later, it cannot substantially reach down to the bottom 6b of the difficult-to-access recess 6. For implementing that step as desired, it is of importance to properly determine the size Wr of the difficult-to-access recess 6, and implement precisely vertical film formation. If required, it is preferable to adjust the film-formation time.

Figure 7D:
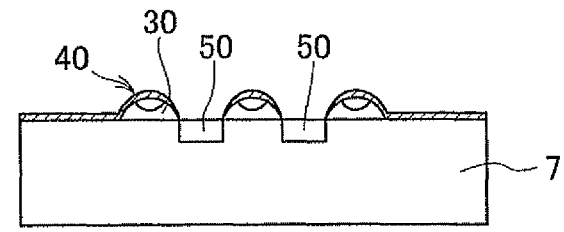

Step of Etching the Substrate Material Via the $1^{st}$ Mask and the Aforesaid $2^{nd}$ Mask Then, as depicted in FIG. 7D, there is the operation implemented of etching the substrate material 7 via the $1^{st}$ mask 30 and the $2^{nd}$ mask 40. That is, while the projection where the $2^{nd}$ mask 40 is applied onto the $1^{st}$ mask 30 is used as a mask, the difficult-to-access recess 6 is etched whereby a recess 50 is formed on the surface of the substrate material 7. It is usually desired that the substrate material 7 be etched by dry etching such as reactive gas etching, and reactive ion etching.

For a choice of the etching gas for etching of the substrate material, for instance, a combination of etching gas with the substrate material 7 plus the $2^{nd}$ mask material having good etching resistance may properly be determined such that there is an increased etching selection ratio achieved. For instance, when the substrate material 7 is quartz, it is preferable to use Cr for the $2^{nd}$ mask material and carbon tetrafluoride ($CF_4$) for the etching gas, and when the substrate material 7 is silicon, it is preferable to use $SiO_2$ for the $2^{nd}$ mask material and hydrogen bromide (HBr) for the etching gas.

Figure 7E:
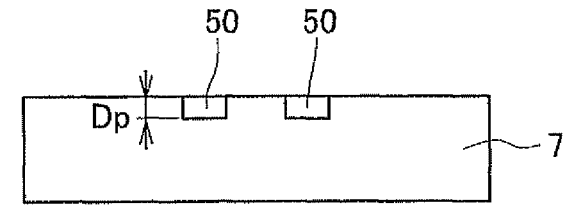

As depicted in FIG. 7E, the depth Dp of the recess 50 in the substrate material 7 capable of being etched is determined by the etching resistance or the like of the $1^{st}$ mask 30 and the $2^{nd}$ mask 40; however, the depth Dp of the recess 50 could be up to about 20 nm as an example, because the $2^{nd}$ mask 40 having good etching resistance is provided in the invention.

Step of Removing the $1^{st}$ Mask and the $2^{nd}$ Mask

After the step of etching the substrate material 7 as described above, there is the step provided of removing the $1^{st}$ mask 30 and the $2^{nd}$ mask 40, ending up with the state depicted in FIG. 7E. It is thus possible to obtain the substrate material 7 having the recesses 50 formed in the desired pattern.

The substrate material 7 having such a desired pattern formed on it, for instance, may be applied to the production of electronic parts equipped with semiconductor integrated circuits or high-density recording media.

In the embodiments as described above, the recesses formed by the presence of the $1^{st}$ mask are all formed of difficult-to-access recesses; in actual applications, however, there could be an embodiment wherein care must be taken of easy-to-access recesses larger in size than the difficult-to-access recesses.

In what follows, reference will be made to a possible pattern-formation process in the case where the aforesaid difficult-to-access recesses plus easy-to-access recesses are present.

It is to be noted that as will also be appreciated from the description of the pattern-formation process to be given later, the "easy-to-access recess" refers to a recess sized (or dimensioned) such that when the $2^{nd}$ mask-formation material is flown and deposited by the physical evaporation method vertically to the major surface of the substrate material 7, it can substantially reach down to the bottom of the easy-to-access recess 6. In particular, the bottom of the easy-to-access recess being incapable of being clearly processed by dry etching in a later step is judged as a level of substantially reaching.

Third Embodiment

The pattern-formation process according to the third embodiment of the invention will now be explained with reference to FIGS. 9A to 9C and FIGS. 10A to 10D. The third embodiment of the invention, too, embraces as the fundamental steps such similar essential steps as in the first and second embodiments.

And according to this embodiment, even when there is the easy-to-access recess present that is larger in size than the difficult-to-access recess, a portion of the substrate material in a site corresponding to that easy-to-access recess can just only be etched, but a portion of the substrate material in a site corresponding to the difficult-to-access recess can also be etched as is the case with the first or second embodiment.

Step of Providing a Substrate Material Having a Difficult-to-Easy Access Recess and an Easy-to-Access Recess Formed by the Presence of the $1^{st}$ Mask In the third embodiment of the invention, there is the step implemented of using a preferable nanoimprint method to provide a substrate material having the $1^{st}$ mask and a difficult-to-access recess and an easy-to-access recess formed by the presence of the $1^{st}$ mask.

Taking the photonanoimprint method as an example, the nanoimprint method is now explained as is the case with the first embodiment of the invention.

Figure 9A:
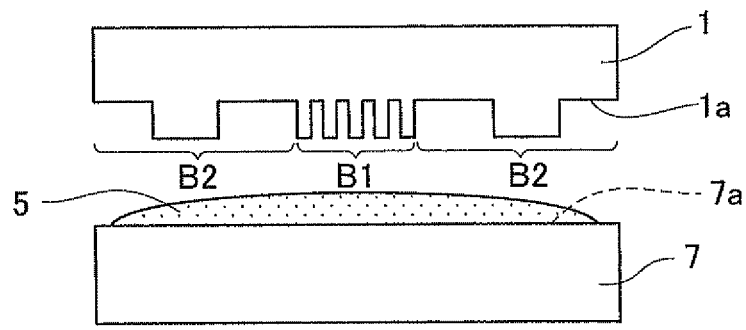
FIGS. 9A, 9B and 9C are illustrative in schematic section and over time of an embodiment of the inventive pattern-formation process using an imprint method, in which there are difficult-to-access recesses plus easy-to-access recesses present.

With the photonanoimprint method, a photocurable resin material 5 as a workpiece to be transferred is fed to and located on a surface 7a of a substrate material (often called the substrate) 7 for nanoimprinting, as shown typically in FIG. 9A. The resin material 5 may be fed in an appropriate mode such as a dispenser or inkjet mode. While one droplet of the resin material 5 is shown, it is to be understood that how many droplets of the resin material 5 are used, and where they are dropped may optionally be set, and the respective droplets may vary in amount as well. Alternatively, spin coating or the like may be applied to coat the photocurable resin material 5 on the surface 7a of the substrate material 7 as a uniform film or, otherwise, the resin material may be located on the side of a mold 1 rather than on the side of the substrate material 7.

The material, shape, structure and such of the substrate material 7 for imprinting may be in accordance with the first embodiment of the invention.

As depicted in FIG. 9A, the mold 1 is located and provided in opposition to the substrate material 7 for imprinting. The surface 1a of the mold 1 is built up of a recess-and-projection structure area B1 capable of forming a site including a difficult-to-access recess, and a recess-and-projection structure area B2 capable of forming a site including an easy-to-access recess. While the structure to be transferred is illustrated as being convex with respect to the surface 1a of the mold 1, it is to be understood that the structure to be transferred may be of either concave or concavoconvex shape.

The mold 1 may be formed of any suitable material; however, when the resin material 5 is photocurable, the mold 1 may be formed of a substrate material transparent to curing light to cure the resin material 5. The specific materials have already been referred to herein. However, it is to be noted that when the substrate material 7 is transparent to the curing light, the mold 1 is not necessarily formed of a transparent material; so it may be formed of a metal such as nickel, titanium, and aluminum, a semiconductor such as silicon, and gallium nitride.

The mold 1 may have, a thickness determined while taking the shape of the recess-and-projection structure, the strength of the substrate material, handleability, etc. in consideration, and that thickness may optionally be selected from a range of typically about 300 μm to about 10 mm. The mold 1 may also have a so-called mesa structure in which the recess-and-projection structure areas B1 and B2 are convex with respect to a plain area outside them. Two or more such mesa structures may be used, to say nothing of one such mesa structure.

Figure 9B:
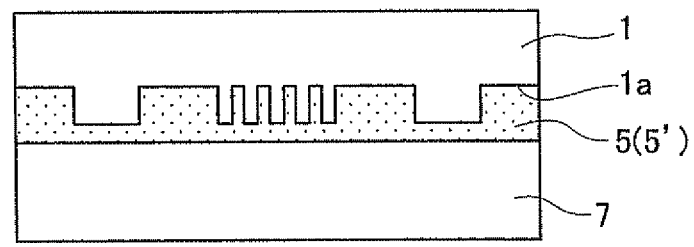

Then, as depicted in FIG. 9B, the located resin material 5 is brought in contact with one surface 1a of the mold 1 having the desired recess-and-projection structure. The resin material 5 to be transferred is filled up in the recess-and-projection structure of the mold 1 by the capillary phenomenon, although depending on the viscosity of the resin material 5. If required, the mold 1 or the substrate material 7 may be forced upon the opposite surface side to help fill the resin material 5 up in the recess-and-projection structure. In this state of contact of the mold 1 with the substrate material 7 via the resin material 5, the resin material 5 turns into a resin layer having the recess-and-projection structure, and as that resin layer is irradiated with ultraviolet radiation, it causes the resin material 5 to be cured (the so-called resin curing step).

Figure 9C:
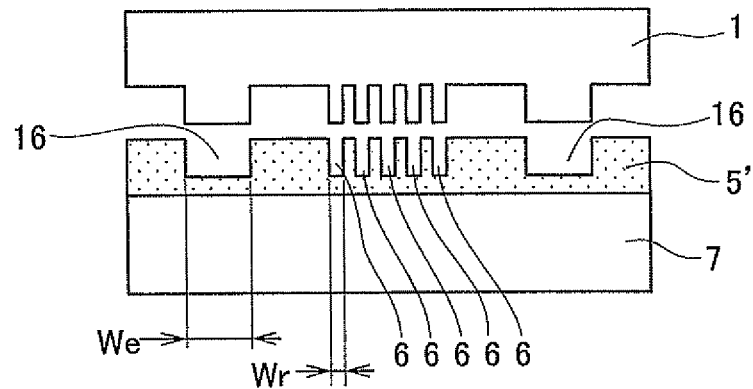

Thereafter, as depicted in FIG. 9C, the peeling step is implemented to apply peeling force in such a way as to widen the spacing distance between the substrate material 7 for imprinting and the mold 1, thereby pulling the mold 1 off a resin layer 5'. Upon pulling operation, pulling force may be applied from either the mold 1 side or the substrate material 7 side or from both.

Upon application of the pulling force to the mold 1 side, uniform force may be applied to the resin layer 5', but for easier pulling, it is preferable to apply the force to the resin layer 5' unevenly. This is because as the force is applied unevenly to the resin layer 5', it results in the creation of a peeling start point from which smooth peeling can take place.

By pulling the mold 1 off the resin layer 5', the resin layer 5' having recess-and-projection structures that are a reversal of the recess-and-projection structures the mold 1 has is transferred onto the substrate material 7 for imprinting. It is to be noted that all of the resin material 5 is not entirely received in the recesses in the mold 1 upon forcing of the mold depicted in FIG. 9B, so the remainder is left on the surface 7a of the substrate material 7 in the form of a residual film (or residue).

Thus, the step of providing a substrate material having the $1^{st}$ mask and the difficult-to-access recess 6 and easy-to-access recess 16 formed by the presence of the $1^{st}$ mask is finished as depicted in FIG. 9C. The resin layer 5' having a projection structure is corresponding to the $1^{st}$ mask, and the difficult-to-access recess 6 (of Wr in size) and easy-to-access recess 16 (of We in size) are each formed by the presence of the resin layer 5' having a projection structure (the $1^{st}$ mask).

While the step of providing a substrate material having the $1^{st}$ mask 5' and the difficult-to-access recess 6 and easy-to-access recess 16 formed by the presence of the $1^{st}$ mask 5' may be completed by removal of the residual film, it is to be understood that removal of the residual film should preferably be implemented after the formation of the $2^{nd}$ mask to be described later, because removal of the residual film at this point has action on a decrease in the height of the $1^{st}$ mask.

In the invention, the size determination for the aforesaid difficult-to-access recess 6 is of great importance as previously described, and the size Wr of the difficult-to-access recess 6 is determined such that when the aforesaid $2^{nd}$ mask-formation material is flown and deposited by the physical evaporation method vertically to the major surface of the substrate material 7, it cannot substantially reach down to the bottom of the difficult-to-access recess 6.

As previously described, the size Wr of the difficult-to-access recess 6 may be determined on a major premise that film-formation be implemented vertically to the major surface of the substrate material; however, this may be affected by the size of flying film-formation particles, the height-to-width aspect ratio of the difficult-to-access recess 6, etc. For instance, as flying film-formation particles grow large in size, it causes the allowable size Wr of the difficult-to-access recess 6 to tend to increase a bit, if not large. As the aspect ratio grows high, it again causes the allowable size Wr of the difficult-to-access recess 6 to tend to increase a bit, if not large. Even given the physical evaporation method, the allowable size Wr of the difficult-to-access recess 6 tends to differ depending on the film-formation method used, for instance, depending on whether it is a sputtering method or a vacuum evaporation method. That is, the sputtering method is more unlikely to form a film in the difficult-to-access recess 6 in the fine pattern as compared with the vacuum evaporation method, and the allowable size Wr of the difficult-to-access recess 6 tends to increase a bit, if not large. This is because in the sputtering method, atoms are more scattered upon flying due to the impact of ions on a target, and collisions with residual gases, resulting in an increased diffraction to the pattern. From this point of view, it is preferable to use the sputtering method in the invention.

Referring here to a specific numeral level for the size Wr that keeps flying film-formation particles from reaching down to the bottom of the difficult-to-access recess 6, Wr should be 25 nm or less, especially 20 nm or less, preferably 6 to 20 nm, and more preferably 6 to 15 nm.

For how to determine the size Wr of the difficult-to-access recess 6 formed by the presence of the $1^{st}$ mask 5' depending on the pattern embodiment of the difficult-to-access recess 6, see the explanation made in the first embodiment.

The size We of the easy-to-access recess 16, on the other hand, should be determined such that when the $2^{nd}$ mask-formation material is flown and deposited by the physical evaporation method vertically to the major surface of the substrate material 7, it can substantially reach down to the bottom of the easy-to-access recess 16, forming a deposition layer. The size We of the easy-to-access recess 16 should be in a range of typically 30 nm to 10 μm inclusive, and preferably about 50 nm to about 1 μm inclusive.

As this size is less than 30 nm, it is unlikely that the mask-formation material may reach down to the bottom of the easy-to-access recess 16. Even if the mask-formation material is deposited on the bottom of the easy-to-access recess 16, later operation of removal by etching of the layer deposited at the bottom will tend to get difficult by reason of the micro-loading effect.

When this size is greater than 10 μm, the thickness of deposits on the bottom of the recess will be equal to the thickness of deposits on the upper surface of the projection; so it will be difficult to implement operation of removing only deposits on the bottom of the recess while leaving the deposits on the upper surface of the projection as a mask in the later etching step.

The production process of the invention is further explained with reference to FIGS. 10A, 10B, 10C and 10D.

Figure 10A:
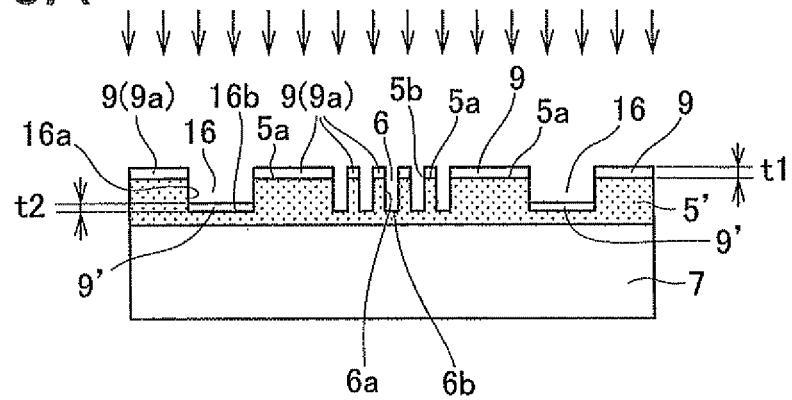
FIGS. 10A, 10B, 10C and 10D are illustrative in schematic section and over time of an embodiment of the inventive pattern-formation process which is carried out following FIG. 9, in which there are difficult-to-access recesses plus easy-to-access recesses present.

Step of Forming the $2^{nd}$ Mask all Over the Upper Surface of the $1^{st}$ Mask and Peripherally on the Side of the Aforesaid Difficult-to-Access Recess As depicted in FIG. 10A, there is the operation implemented of depositing the $2^{nd}$ mask-formation material that is higher than the $1^{st}$ mask 5' in terms of etching resistance all over the upper surface of the $1^{st}$ mask and peripherally on the side 6a of the aforesaid difficult-to-access recess 6 thereby forming the $2^{nd}$ mask 9 comprising a series of films. It is to be noted that the state of deposition of the $2^{nd}$ mask peripherally on the side 6a of the difficult-to-access recess 6 is not clearly illustrated due to limited space, but a precise image of this state would be seen from FIG. 2B presented for the first embodiment of the invention.

It is also to be noted that the term "peripherally" referred to herein is typically synonymous with what is described in the aforesaid first embodiment of the invention.

In this embodiment of the invention, too, it is the "upper surface" of the $1^{st}$ mask that is corresponding to the substantially flat top 5a of the convex $1^{st}$ mask 5', and it is the side of the difficult-to-access recess 6 that is corresponding to the surface 6a of the convex $1^{st}$ mask 5'—forming the difficult-to-access recess 6—that depends down from the peripheral edge 5b of the substantially flat top 5a, as is the case with the aforesaid first embodiment of the invention. A portion of the $2^{nd}$ mask 9 formed on the upper surface of the $1^{st}$ mask 5' is called an upper portion 9a of the $2^{nd}$ mask, and a portion of the $2^{nd}$ mask 9 corresponding to the side of the $1^{st}$ mask 5' and formed on the side 6a of the difficult-to-access recess 6 is called a side of the $2^{nd}$ mask 9 (not shown).

In this embodiment of the invention wherein there are the difficult-to-access recess 6 plus the easy-to-access recess 16, the $2^{nd}$ mask-formation material is deposited at the bottom 16b of the easy-to-access recess 16, forming a bottom deposition layer 9', as shown. Being analogous to the $2^{nd}$ mask 9, the bottom deposition layer 9' may also be called a deposition layer stemming from the $2^{nd}$ mask during its formation or a "portion of the $2^{nd}$ mask deposited at the bottom of the easy-to-access recess". The thickness of this bottom deposition layer 9' is here indicated by t2. It is to be noted that as the $2^{nd}$ mask is formed, usually, the $2^{nd}$ mask-formation material is deposited at the side 16a of the easy-to-access recess 16 too, although not shown.

The thickness t1 of the upper portion 9a of the $2^{nd}$ mask formed as the $2^{nd}$ mask is formed by physical evaporation and the thickness t2 of the bottom deposition layer 9' at the bottom 16b of the easy-to-access recess 16 have a relation: t1>t2. This is because when the $2^{nd}$ mask-formation material is deposited by physical evaporation on the recess-and-projection pattern, it is more likely to be deposited on the projection surface than in the easy-to-access recess 16 having such size We as described above.

The thickness t1 of the upper portion of the $2^{nd}$ mask formed on the substantially flat upper surface (top) 5a of the convex $1^{st}$ mask 5' should be in a range of typically about 0.5 nm to about 3 nm.

While it is ideal that the $2^{nd}$ mask-formation material is deposited on the top-to-bottom entire side 6a of the difficult-to-access recess 6 to form the side of the $2^{nd}$ mask as is the case with the first embodiment of the invention, it is to be understood that there is no need for going to that far in the invention. In other words, it is needed just only to deposit the $2^{nd}$ mask-formation material on a portion from the upper end 5b of the side 6a of the difficult-to-access recess 6 (the same as the peripheral edge 5b of the substantially flat top 5a of the convex $1^{st}$ mask 5') going down (toward the substrate material 7) to form the side of the $2^{nd}$ mask. Here given the entire area S1 of the side 6a of the difficult-to-access recess 6, the area ratio of the side of the $2^{nd}$ mask deposited on the side 6a of the recess 6 should desirously fall within a range of preferably (0.3 to 1.0) S1, and more preferably (0.5 to 1.0) S1. This is to improve side etching resistance on the side of the $1^{st}$ mask 5'.

It is to be noted that the amount of deposition of the $2^{nd}$ mask-formation material on the side of the $2^{nd}$ mask reaches a maximum at the upper end 5b of the side 6a of the difficult-to-access recess 6, and tends to decrease from there down toward the substrate material 7.

For instance, the $2^{nd}$ mask-formation material is preferably made up of a metal, a metal oxide, a metal nitride, a semiconductor, a semiconductor oxide, or a semiconductor nitride. More specifically, there is the mention of at least one species selected from the group consisting of Cr, Al, Si, Ta, Ti, Ag, Au, Co, Cu, Ni, Pd, Pt, and Mo or a nitride, oxide or the like of the elements in this group. As already mentioned, however, it is necessary for the $2^{nd}$ mask-formation material to be higher than the $1^{st}$ mask in terms of etching resistance; so an appropriate selection may be made while the material of the $1^{st}$ mask and the specific etching method are taken into consideration.

In this step of the invention, there is the operation implemented of flying and depositing the $2^{nd}$ mask-formation material by the physical evaporation method vertically to the major surface of the substrate material. The term "vertically" to the major surface of the substrate material embraces a tolerance of ±10°, although the tolerance of ±5° is preferred. The physical evaporation method is exemplified by various sputtering methods (conventional sputtering, magnetron sputtering, ion beam sputtering, ECR sputtering or the like) as well as various evaporation methods (vacuum evaporation, molecular beam evaporation, ion plating, ion beam evaporation or the like).

Among others, the sputtering method is most preferable. This is because the sputtering method causes atoms to be more scattered upon flying due to the collisions of ions and residual gases on a target than the vacuum evaporation method, so that diffraction to the pattern grows more, making it less likely to form a film at the bottom of the fine pattern.

In this step of the invention, there is the operation implemented of depositing the $2^{nd}$ mask-formation material all over the upper surface 5a of the $1^{st}$ mask 5' and peripherally on the side 6a of the difficult-to-access recess 6 thereby forming the $2^{nd}$ mask 9 comprising a series of films. In this case, any film comprising the $2^{nd}$ mask-formation material is not substantially formed at the bottom 6b of the difficult-to-access recess 6; in this embodiment having the easy-to-access recess 16, however, the $2^{nd}$ mask-formation material is deposited at the bottom 16b of the easy-to-access recess 16, forming the bottom deposition layer 9'. In addition, the $2^{nd}$ mask-formation material is deposited on the side 16a of the easy-to-access recess 16 too, forming a side layer although not illustrated.

The reason why any film comprising the $2^{nd}$ mask-formation material is not substantially formed at the bottom 6b of the difficult-to-access recess 6 is that, as described above, the size Wr of the difficult-to-access recess 6 is determined such that when the $2^{nd}$ mask-formation material is flown and deposited by the physical evaporation method vertically to the major surface of the substrate material, it cannot substantially reach down to the bottom 6b of the difficult-to-access recess 6. To implement that step as desired, it is of importance to properly determine the size Wr of the difficult-to-access recess 6, and implement vertical film formation. If required, it is preferable to adjust the film-formation time.

Figure 10B:
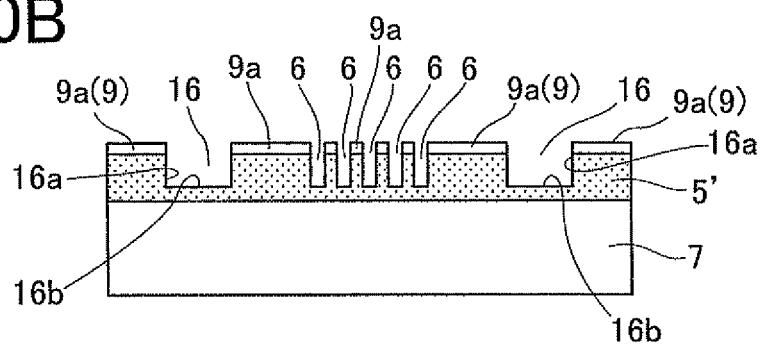

Step of Removing the Bottom Deposition Layer Deposited on the Bottom of the Easy-to-Access Recess Then, as depicted in FIG. 10B, there is the step implemented of removing the bottom deposition layer 9' deposited on the bottom 16b of the easy-to-access recess 16. The bottom deposition layer 9' is removed by etching. In this case, a side layer formed of the $2^{nd}$ mask-formation material formed on the side 16a of the easy-to-access recess 16 is removed too. For instance, the etching should preferably be implemented by dry etching such as reactive ion etching (RIE), and reactive gas etching. The use of the dry etching enables the bottom deposition layer 9' formed at the bottom 16b of the easy-to-access recess 16 to be selectively etched without doing damage to the bottom 6b of the difficult-to-access recess 6. This is because the dry etching generally gives rise to what is called the microloading effect that results in the phenomenon in which the finer the pattern, the lesser likely etching is to take place. Especially if etching conditions are optionally set, it is then possible to gain control of the magnitude of the microloading effect.

It is to be noted that at the time of completion of removal of the bottom deposition layer 9' present at the bottom 16b of the easy-to-access recess 16, the upper portion 9a of the $2^{nd}$ mask formed on the top of the $1^{st}$ mask decreases slightly in thickness, but it could still function as a mask of certain thickness. As previously described, this is because the thickness t1 of the upper portion 9a of the $2^{nd}$ mask formed upon formation of the $2^{nd}$ mask and the thickness t2 of the bottom deposition layer 9' formed at the bottom 16b of the easy-to-access recess 16 have a relation: t1>t2.

It is to be noted that the deposition layer deposited in the easy-to-access recess 16 is not necessarily entirely removed in this step; in other words, it may be removed to such an extent as to offer no problem with the etching of the substrate material in the next substrate material-etching step.

Figure 10C:
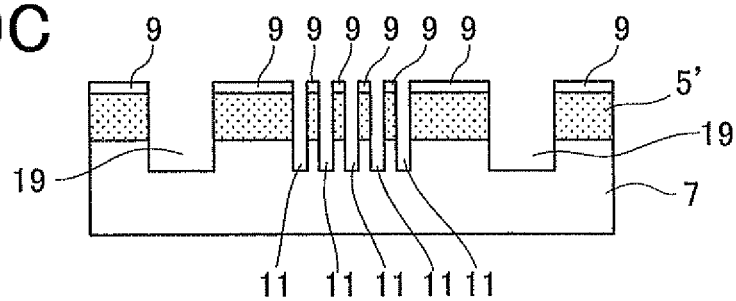

Step of Etching the Substrate Material Via the $1^{st}$ Mask and the Aforesaid $2^{nd}$ Mask Then, as depicted in FIG. 10C, there is the step implemented of etching the substrate material 7 via the $1^{st}$ mask 5' and the $2^{nd}$ mask 9.

That is, while the projection where a thin film comprising the $2^{nd}$ mask 9 is applied onto the $1^{st}$ mask 5' is used as a mask, the difficult-to-access recess 6 and the easy-to-access recess 16 are etched whereby a fine recess 11 corresponding to the bottom size of the difficult-to-access recess 6 and a fine recess 10 corresponding to the bottom size of the easy-to-access recess 16 are respectively formed on the surface of the substrate material 7. It is to be noted that when the $1^{st}$ mask 5' is formed by the nanoimprint method, there is usually a residual film present at the bottom 6b of the difficult-to-access recess 6, and at the bottom 16b of the easy-to-access recess 16; so the step of etching the substrate material 7 is preferably implemented after removal of that residual film by oxygen plasma treatment (ashing treatment) or the like.

It is usually desired that the substrate material 7 be etched by dry etching such as reactive gas etching, and reactive ion etching.

For a choice of the etching gas for etching of the substrate material 7, for instance, a combination of the etching gas with the substrate material 7 plus the mask of the $2^{nd}$ mask 9 having good etching resistance may properly be determined such that there is an increased etching selection ratio achieved. For instance, when the substrate material 7 is quartz, it is preferable to use Cr for the 2$^{nd}$ mask material and carbon tetrafluoride (CF$_4$) for the etching as, and when the substrate material 7 is silicon, it is preferable to use SiO$_2$ for the 2$^{nd}$ mask material and hydrogen bromide (HBr) for the etching gas.

Figure 10D:
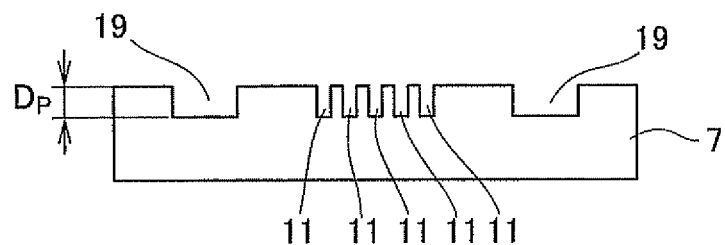

As depicted in FIG. 10D, the depth Dp of the recess 11 in the substrate material 7 capable of being etched is determined by the etching resistance or the like of the 1$^{st}$ mask 5' and the 2$^{nd}$ mask 9; however, the depth Dp of the recesses 11 and 19 formed by etching could be up to about 20 nm as an example, because the 2$^{nd}$ mask 9 having good etching resistance is provided in the invention (see FIG. 10D).

Step of Removing the 1$^{st}$ Mask and the 2$^{nd}$ Mask

After the step of etching the substrate material 7 as described above, there is the step provided of removing the 1$^{st}$ mask 5' and the 2$^{nd}$ mask 9, ending up with the state depicted in FIG. 10D. It is thus possible to obtain the substrate 7 having the recesses 11 formed in the desired pattern.

The substrate 7 having such a desired pattern formed on it, for instance, may be applied to the production of electronic parts equipped with semiconductor integrated circuits or high-density recording media.

Fourth Embodiment

The pattern-formation process according to the fourth embodiment of the invention will now be explained with reference to FIGS. 11A to 11E and FIGS. 12A to 12G.

The fourth embodiment relates to the pattern-formation process in the case where there are the difficult-to-access recess plus the easy-to-access recess present, as is the case with the aforesaid third embodiment. The fourth embodiment of the invention, too, embraces as the fundamental steps such similar steps as in the first, second and third embodiments.

And according to this embodiment, even when there is the easy-to-access recess present that is larger in size than the difficult-to-access recess, a portion of the substrate material in a site corresponding to that easy-to-access recess can just only be etched, but a portion of the substrate material in a site corresponding to the difficult-to-access recess can also be etched as is the case with the first, second or third embodiment.

In the fourth embodiment of the invention, as the pre-steps, there are the steps implemented of providing a substrate material having a difficult-to-access recess and an easy-to-access recess formed by the presence of the 1$^{st}$ mask, sealing the difficult-to-access recess up with a sealing material, and etching the substrate material via the 1$^{st}$ mask, after which the operation including such essential steps as in the first, second and third steps is implemented.

In what follows, this embodiment is explained in order with reference to the drawings.

Step of Providing a Substrate Material Having a Difficult-to-Access Recess and an Easy-to-Access Recess Formed by the Presence of the 1$^{st}$ Mask The nanoimprint method is taken as a preferable method, and this step is explained while a photonano-imprint method is taken as the nanoimprint method, as is the case with the first embodiment of the invention.

Taking the photonanoimprint method as an example, the nanoimprint method is now explained as is the case with the first embodiment of the invention.

Figure 11A:
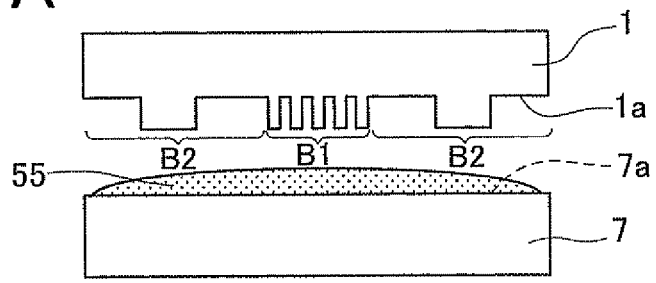
FIGS. 11A, 11B, 11C, 11D and 11E are illustrative in schematic section and over time of an embodiment of the inventive pattern-formation process using an imprint method, in which there are difficult-to-access recesses plus easy-to-access recesses present.

With the photonanoimprint method, the photocurable resin material 55 as a workpiece to be transferred is fed to and located on the surface 7a of a substrate material (often called the substrate) 7 for nanoimprinting, as shown typically in FIG. 11A. The resin material 55 may be fed in an appropriate mode such as a dispenser or inkjet mode. While one droplet of the resin material 55 is shown, it is to be understood that how many droplets of the resin material 5 are used, and where they are dropped may optionally be set, and the respective droplets may vary in amount as well. Alternatively, spin coating or the like may be applied to coat the photocurable resin material 55 on the surface 7a of the substrate material 7 as a uniform film or, otherwise, the resin material may be located on the side of the mold 1 rather than on the side of the substrate 7.

The material, shape, structure and such of the substrate 7 for imprinting may be in accordance with the first, second and third embodiments of the invention.

As depicted in FIG. 11A, the mold 1 is located and provided in opposition to the substrate material 7 for imprinting. One surface 1a of the mold 1 is built up of a recess-and-projection structure area B1 capable of forming a site including a difficult-to-access recess, and a recess-and-projection structure area B2 capable of forming a site including an easy-to-access recess. While the structure to be transferred is illustrated as being convex with respect to the surface 1a of the mold 1, it is to be understood that the structure to be transferred may be of either concave or concavoconvex shape.

The mold 1 may be formed of any suitable material; however, when the resin material 55 is photocurable, the mold 1 may be formed of a substrate material transparent to curing light to cure the resin material 55. The specific materials have already been referred to herein. However, it is to be noted that when the substrate material 7 is transparent to the curing light, the mold 1 is not necessarily formed of a transparent material; so it may be formed of a metal such as nickel, titanium, and aluminum, a semiconductor such as silicon, and gallium nitride.

The mold 1 may have a thickness determined while taking the shape of the recess-and-projection structure, the strength of the substrate material, handleability, etc. in consideration, and that thickness may optionally be selected from a range of typically about 300 μm to about 10 mm. The mold 1 may also have a so-called mesa structure in which the recess-and-projection structure areas B1 and B2 are convex with respect to a plain area outside them. Two or more such mesa structures may be used, to say nothing of one such mesa structure.

Figure 11B:
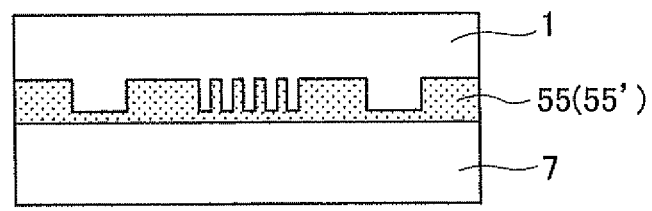

Then, as depicted in FIG. 11B, the located resin material 55 is brought in contact with the surface 1a of the mold 1 having the desired recess-and-projection structure. The resin material 55 to be transferred is filled up in the recess-and-projection structure of the mold 1 by the capillary phenomenon, although depending on the viscosity of the resin material 55. If required, the mold 1 or the substrate material 7 may be forced upon the opposite surface side to help fill the resin material 55 up in the recess-and-projection structure. In this state of contact of the mold 1 with the substrate material 7 via the resin material 55, the resin material 55 turns into a resin layer having the recess-and-projection structure, and as that resin layer is irradiated with ultraviolet radiation, it causes the resin material 55 to be cured (the so-called resin curing step). It is to be noted that while the resin material 55 used in this step is preferably the same as the resin material 59 to be described later and the resin material 5, other different material may also be used.

Figure 11C:
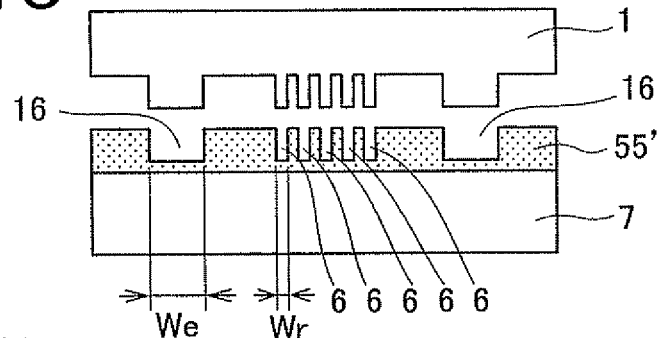
Figure 11D:
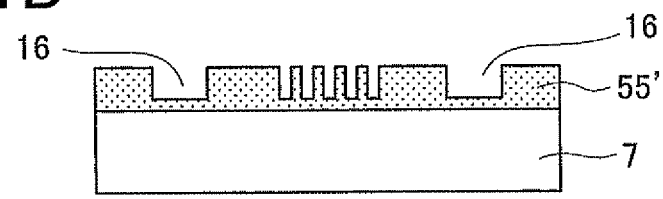

Thereafter, as depicted in FIG. 11C, the peeling step is implemented to apply peeling force in such a way as to widen the spacing distance between the substrate material 7 for imprinting and the mold 1, thereby pulling the mold 1 off a resin layer 55'. Upon pulling operation, pulling force may be applied from either the mold 1 side or the substrate material 7 side or from both.

When the pulling force is applied to the mold 1 side, the force may be applied uniformly to the resin layer 55'; however, it is preferable that uneven force is applied to the resin layer 55' for easier pulling, because the application of uneven force to the resin layer 55' allows for the creation of a peeling start point from which smooth peeling takes place.

By pulling the mold 1 off the resin layer 55', the resin layer 55' having recess-and-projection structures that are a reversal of the recess-and-projection structures the mold 1 has is transferred onto the substrate material 7 for imprinting. It is to be noted that all of the resin material 55 is not entirely received in the recesses in the mold 1 upon forcing of the mold depicted in FIG. 11B, so the remainder is left on the surface 7a of the substrate material 7 in the form of a residual film (or residue).

Thus, the step of providing a substrate material having the $1^{st}$ mask and the difficult-to-access recess 6 and easy-to-access recess 16 formed by the presence of the $1^{st}$ mask is finished as depicted in FIG. 11C. The resin layer 55' having a projection structure is corresponding to the $1^{st}$ mask, and the difficult-to-n access recess 6 (of Wr in size) and easy-to-access recess 16 (of We in size) are each formed by the presence of the resin layer 55' having a projection structure (the $1^{st}$ mask). The action demanded for the difficult-to-access recess 6 and the easy-to-access recess 16, and the incidental size, etc. may be set as already described.

Step of Sealing the Difficult-to-Access Recess Up with a Sealing Material

Figure 11E:
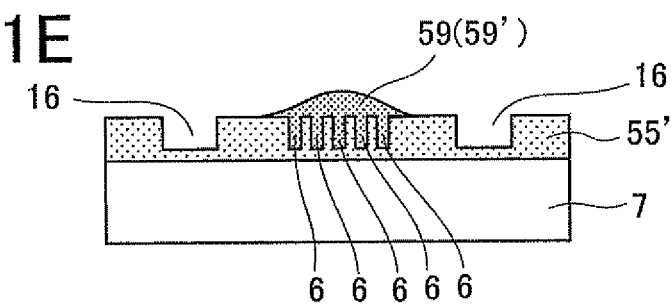

Then, as depicted in FIG. 11E, there is the step provided of sealing the difficult-to-access 6 up with a sealing material. The sealing method used, for instance, may comprise adding droplets of the resin material 59 down to a pattern area corresponding to the difficult-to-access recesses 6 to cure that resin into a resin layer 59' thereby providing covering.

While the resin material 59 is preferably the same as the aforesaid resin material 55 and the resin material 5 to be described later, different other material may also be used. There is also no limitation on curing means. If the aforesaid resin material 55 is used for the resin material 59, it is then possible to stabilize the etching rate and selection ratio during the later substrate material etching step. The resin material 55 is also preferably capable of being removed by ashing using $O_2$ plasma or the like.

The reason why the difficult-to-access recess 6 is previously filled up with the sealing material is to first etch the surface of a portion of the substrate material corresponding to the easy-to-access recess 16 in the step of etching the substrate material via the $1^{st}$ mask to be described later, thereby forming a recess 19 in that portion of the substrate material (see FIG. 12A).

The method for dropwise addition of the resin material 59 may be carried out in any appropriate mode inclusive of an inkjet mode, a dispenser mode, and a dropper mode, although the inkjet mode is preferred because of being capable of gaining precise control of where to drop the resin material and how much it is dropped.

It is to be noted that when the difficult-to-access recess 6 is filled up with the sealing material such as resin, it may prima facie go down into the difficult-to-access recess 6, but there is no need for it to enter actively inside. What is essentially required for the sealing material (for instance, the resin material 59) is that it provides covering over the pattern area corresponding to the difficult-to-access recesses 6, can function as a mask for etching of the resin material in the later step, and can be peeled alone or together with the resin layer 55'.

Step of Etching the Substrate Material Via the $1^{st}$ Mask

Figure 12A:
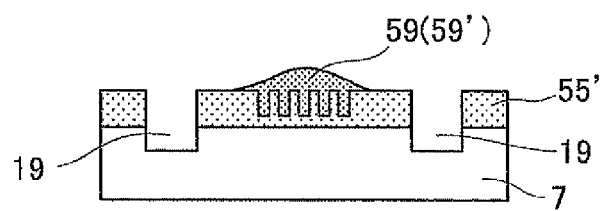
FIGS. 12A, 12B, 12C, 12E, 12F and 12G are illustrative in schematic section and over time of an embodiment of the inventive pattern-formation process which is carried out following FIG. 11, in which there are difficult-to-access recesses plus easy-to-access recesses present.

As depicted in FIG. 12A, the substrate material 7 is etched via the $1^{st}$ mask including the resin layer 59' that is the sealing material, whereby the surface of a portion of the substrate material corresponding to the easy-to-access recess 16 is etched, forming a recess 19 in that portion.

Dry etching such as reactive gas etching and reactive ion etching is preferably used for etching of the substrate material 7, but if the size of the easy-to-access recess 16 is greater than a micron order, wet etching may also be used. It is to be noted that prior to etching of the substrate material 7, any residual film present at the bottom of the easy-to-access recess 16 may be removed.

Figure 12B:
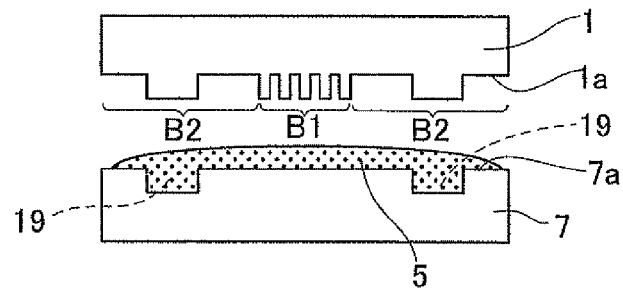

After the recess 19 is formed in this way, the $1^{st}$ mask including the resin layer 59' that is the sealing material is removed, forming the substrate material 7 having such recesses as indicated in the lower position of FIG. 12B. Removal of the $1^{st}$ mask including the resin layer 59' for sealing may be carried out using an ashing method using $O_2$ plasma, a peeling method using a strong acid such as sulfuric acid/peroxide hydrogen or the like.

Step of Providing a Substrate Material Including a Difficult-to-Access and an Easy-to-Access Recess Formed By the Presence of the $1^{st}$ Mask There is the step implemented of providing a substrate material including a difficult-to-access recess and an easy-to-access recess formed by the presence of the $1^{st}$ mask pursuant to such a method similar as mentioned in conjunction with the pre-step of providing a difficult-to-access recess and an easy-to-access recess formed by the presence of the $1^{st}$ mask. That is, in the instant embodiment, a mold having the same recess-and-projection pattern as employed in the pre-step is used to provide a substrate material including a difficult-to-access recess and an easy-to-access recess formed by the nanoimprint method.

In this case, alignment operation is implemented such that the difficult-to-access and easy-to-access recesses are formed by the presence of the $1^{st}$ mask in the same positions as those formed by the presence of the $1^{st}$ mask in the pre-step. For alignment, for instance, if alignment marks are previously put in the mold and substrate material, respectively, it is then possible to identify alignment of both positions by an optical microscope, a SEM or the like.

While the mold used in the instant embodiment should desirously be the same as used in the pre-step, it is to be understood that the same mold as employed in the pre-step is not always necessary if it has the same recess-and-projection pattern.

As in the previous embodiments, the nanoimprint method is now explained taking the photonanoimprint method as an example.

A photocurable resin material 5 as the workpiece to be transferred is fed to and located on one surface 7a of a substrate material 7 for nanoimprinting, as shown typically in FIG. 12B. While just one droplet of the resin material 5 is shown, it is to be understood that how many droplets of the resin material 5 are used, where they are dropped and so on may be optional, and the respective droplets may vary in amount as well. Alternatively, spin coating or the like may be applied to coat the photocurable resin material 5 on the surface 7a of the substrate material 7 as a uniform film or, otherwise, the resin material may be located on the side of a mold 1 rather than on the side of the substrate 7. In this case, the recess 19 is filled up inside with the resin material 5 too.

Figure 12C:
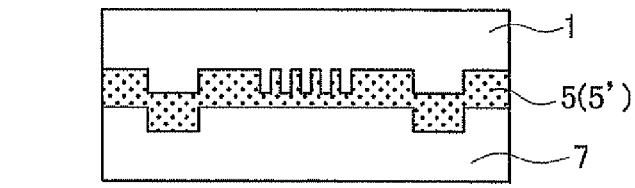

Then, as depicted in FIG. 12C, the located resin material 5 is brought in contact with one surface 1a of the mold 1 having the desired recess-and-projection structure. The resin material 5 to be transferred is filled up in the recess-and-projection structure of the mold 1 by the capillary phenomenon, although depending on the viscosity of the resin material 5. In this state of contact of the mold 1 with the substrate material 7 via the resin material 5, the resin material 5 turns into a resin layer having the recess-and-projection structure, and as that resin layer is irradiated with ultraviolet radiation, it causes the resin material 5 to be cured (the so-called resin curing step).

Thereafter, the peeling step is implemented to apply peeling force in such a way as to widen the spacing distance between the substrate material 7 for imprinting and the mold 1, thereby pulling the mold 1 off a resin layer 5', although not shown.

Figure 12D:
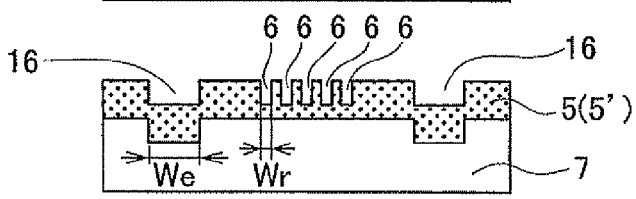

By pulling the mold 1 off the resin layer 5', the resin layer 5' having recess-and-projection structures that are a reversal of the recess-and-projection structures the mold 1 has is transferred onto the substrate material 7 for imprinting, as shown in FIG. 12D. Thus, the step of providing a substrate material having the $1^{st}$ mask and the difficult-to-access recess 6 and easy-to-access recess 16 formed by the presence of the $1^{st}$ mask is finished by pulling the mold 1 off the state of FIG. 12C (see FIG. 12D).

As depicted in FIG. 12D, the resin layer 5' having the projection structure is corresponding to the $1^{st}$ mask, and the difficult-to-access recess 6 (of Wr in size) and easy-to-access recess 16 (of We in size) are each formed by the presence of the resin layer 5' (the $1^{st}$ mask) having the projection structure.

In the invention, the size determination of the aforesaid difficult-to-access recess 6 is of very importance as already described, and the size Wr of the difficult-to-access recess 6 is determined such that when the aforesaid $2^{nd}$ mask-formation material is flown and deposited by the physical evaporation method vertically to the major surface of the substrate material 7 as previously noted, it cannot substantially reach down to the bottom of the difficult-to-access recess.

Referring to a specific numeral level of the size Wr acting to keep flying film-formation particles from not reaching down to the bottom of the difficult-to-recess 6 as previously noted, Wr should be 25 nm or less, especially 20 nm or less, preferably 6 to 20 nm, and more preferably 6 to 15 nm.

The size We of the easy-to-access recess 16 is determined such that when the $2^{nd}$ mask-formation material is flown and deposited by the physical evaporation method vertically to the major surface of the substrate material 7 as previously noted, it can substantially reach down to the bottom of the easy-to-access recess 6, forming a deposition layer. For instance, the size We of the easy-to-access recess 16 may be 30 nm to 10 μm inclusive, and preferably 50 nm to 1 μm inclusive.

Figure 12E:
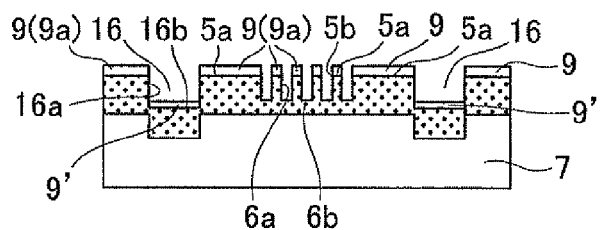

Step of Forming the $2^{nd}$ Mask all Over the Upper Surface of the $1^{st}$ Mask and Peripherally on the Side of the Aforesaid Difficult-to-Access Recess As depicted in FIG. 12E, there is the operation implemented of depositing the $2^{nd}$ mask-formation material that is higher than the $1^{st}$ mask 5' in terms of etching resistance all over the upper surface of the $1^{st}$ mask and peripherally on the side 6a of the aforesaid difficult-to-access recess 6 thereby forming the second mask 9 comprising a series of films. It is to be noted that the state of deposition of the $2^{nd}$ mask peripherally on the side 6a of the difficult-to-access recess 6 is not clearly illustrated in FIG. 12E due to limited space, but a precise image of this state would be seen from FIG. 2B presented for the first embodiment of the invention.

It is also to be noted that the term "peripherally" referred to herein is typically synonymous with what is described in the aforesaid first embodiment of the invention.

In this embodiment of the invention, too, it is the upper surface of the $1^{st}$ mask that is corresponding to the substantially flat top 5a of the convex $1^{st}$ mask 5', and it is the side of the difficult-to-access recess 6 that is corresponding to the surface that depends down from the peripheral edge 5b of the substantially flat top 5a of the convex $1^{st}$ mask 5' forming the difficult-to-access recess 6. A portion of the $2^{nd}$ mask 9 formed on the upper surface of the $1^{st}$ mask 5' is called an upper portion 9a of the $2^{nd}$ mask, and a portion of the $2^{nd}$ mask 9 corresponding to the side of the $1^{st}$ mask 5' and formed on the side 6a of the difficult-to-access recess 6 is called a side of the $2^{nd}$ mask 9 (not shown).

In this step of the instant embodiment of the invention wherein there are the difficult-to-access recess 6 plus the easy-to-access recess 16 included, the $2^{nd}$ mask-formation material is deposited at the bottom 16b of the easy-to-access recess 16, forming the bottom deposition layer 9'. Being analogous to the $2^{nd}$ mask 9, the bottom deposition layer 9' may also be called a deposition layer stemming from the $2^{nd}$ mask 9 during its formation or a "portion of the $2^{nd}$ mask deposited at the bottom of the easy-to-access recess". It is to be noted that as the $2^{nd}$ mask is formed, usually, the $2^{nd}$ mask-formation material is deposited at the side 16a of the easy-to-access recess 16 too, although not shown.

The thickness t1 of the upper portion of the $2^{nd}$ mask formed on the substantially flat upper surface (top) 5a of the convex $1^{st}$ mask 5' may be in a range of typically about 0.5 nm to about 3 nm.

While it is ideal that the $2^{nd}$ mask-formation material is deposited on the top-to-bottom entire side 6a of the difficult-to-access recess 6 to form the side 9b of the $2^{nd}$ mask, it is to be understood that there is no need for going to that far in the invention. In other words, it is needed just only to deposit the $2^{nd}$ mask-formation material on a portion from the upper end 5b of the side 6a of the difficult-to-access recess 6 (the same as the peripheral edge 5b of the substantially flat top 5a of the convex $1^{st}$ mask 5') going down (toward the substrate material 7) to form the side of the $2^{nd}$ mask. Here given the entire area S1 of the side 6a of the difficult-to-access recess 6, the area ratio of the side of the $2^{nd}$ mask deposited on the side 6a of the recess 6 should desirously be within a range of preferably (0.3 to 1.0) S1, and more preferably (0.5 to 1.0) S1. This is to improve side etching resistance on the side of the $1^{st}$ mask 5'.

It is to be noted that the amount of deposition of the $2^{nd}$ mask-formation material on the side of the $2^{nd}$ mask reaches a maximum at the upper end 5b of the side 6a of the difficult-to-access recess 6, and tends to decrease from there down toward the substrate material 7.

For instance, the $2^{nd}$ mask-formation material is preferably made of a metal, a metal oxide, a metal nitride, a semiconductor, a semiconductor oxide, or a semiconductor nitride. More specifically, there is the mention of at least one species selected from the group consisting of Cr, Al, Si, Ta, Ti, Ag, Au, Co, Cu, Ni, Pd, Pt, and Mo or a nitride, oxide or the like of the elements in this group. As already mentioned, however, it is necessary for the $2^{nd}$ mask-formation material to be higher than the $1^{st}$ mask 5' in terms of etching resistance; so an appropriate selection may be made while the material of the $1^{st}$ mask 5' and a specific etching method are taken into consideration.

In this step of the invention, there is the operation implemented of flying and depositing the $2^{nd}$ mask-formation material by the physical evaporation method vertically to the major surface of the substrate material. The term "vertically" to the major surface of the substrate material embraces a tolerance of ±10°, although the tolerance of ±5° is preferred. The physical evaporation method is exemplified by various sputtering methods (conventional sputtering, magnetron sputtering, ion beam sputtering, ECR sputtering or the like) as well as various evaporation methods (vacuum evaporation, molecular beam evaporation, ion plating, ion beam evaporation or the like).

Among others, the sputtering method is most preferable. The sputtering method causes atoms to be more scattered upon flying due to the collisions of ions and residual gases on a target, as compared with the vacuum evaporation method, so that diffraction to the pattern grows more, making it less likely to form a film at the bottom of the fine pattern.

In this step of the invention, there is the operation Implemented of depositing the $2^{nd}$ mask-formation material all over the upper surface 5a of the $1^{st}$ mask 5' and peripherally on the side 6a of the difficult-to-access recess 6 thereby forming the $2^{nd}$ mask 9 comprising a series of films. In this case, any film comprising the $2^{nd}$ mask-formation material is not substantially formed at the bottom 6b of the difficult-to-access recess 6; in this embodiment having the easy-to-access recess 16, however, the $2^{nd}$ mask-formation material is deposited at the bottom 16b of the easy-to-access recess 16, forming a bottom deposition layer 9'. In addition, the $2^{nd}$ mask-formation material is deposited on the side 16a of the easy-to-access recess 16 too, forming a side layer although not illustrated.

The reason why any film comprising the $2^{nd}$ mask-formation material is not substantially formed at the bottom 6b of the difficult-to-access recess 6 is that, as described above, the size Wr of the difficult-to-access recess 6 is determined such that when the $2^{nd}$ mask-formation material is flown and deposited by the physical evaporation method vertically to the major surface of the substrate material, it cannot substantially reach down to the bottom 6b of the difficult-to-access recess 6. For implementing that step as desired, it is of importance to properly determine the size Wr of the difficult-to-access recess 6, and implement vertical film formation. If required, it is preferable to adjust the film-formation time.

Figure 12F:
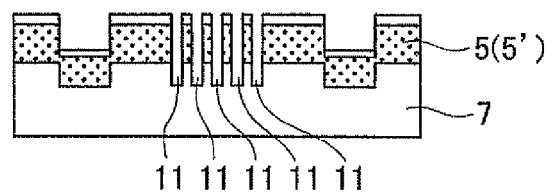

Step of Etching the Substrate Material Via the $1^{st}$ Mask and the Aforesaid $2^{nd}$ Mask Then, as depicted in FIG. 12F, there is the step implemented of etching the substrate material 7 via the $1^{st}$ mask 5' and the $2^{nd}$ mask 9.

That is, while the $2^{nd}$ mask 9 is used as a mask on the $1^{st}$ mask 5' (including the bottom deposition layer 9' formed on the easy-to-access recess 16 and made up of the $2^{nd}$ mask-formation material), the difficult-to-access recess 6 is etched whereby a fine recess 11 corresponding to the bottom size of the difficult-to-access recess 6 is formed on the surface of the substrate material 7. It is to be noted that when the $1^{st}$ mask 5' is formed by the nanoimprint method, there is usually a residual film present at the bottom 6b of the difficult-to-access recess 6; so the step of etching the substrate material 7 is preferably implemented after removal of that residual film by oxygen plasma treatment (ashing treatment) or the like.

It is usually desired that the substrate material 7 be etched by dry etching such as reactive gas etching, and reactive ion etching.

For a choice of the etching gas for etching of the substrate material 7, for instance, a combination of etching gas with the substrate material 7 plus the material of the $2^{nd}$ mask 9 having good etching resistance may properly be determined such that there is an increased etching selection ratio achieved. For instance, when the substrate material 7 is quartz, it is preferable to use Cr for the $2^{nd}$ mask material and carbon tetrafluoride ($CF_4$) for the etching as, and when the substrate material 7 is silicon, it is preferable to use $SiO_2$ for the $2^{nd}$ mask material and hydrogen bromide (HBr) for the etching gas.

Figure 12G:
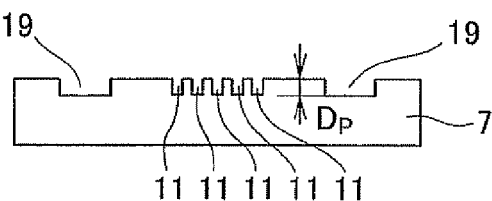

As depicted in FIG. 12G, the depth Dp of the recess 11 in the substrate material 7 capable of being etched is determined by the etching resistance or the like of the $1^{st}$ mask 5' and the $2^{nd}$ mask 9; however, the depth Dp of is the recess 11 formed by etching could be up to about 20 nm as an example, because the $2^{nd}$ mask 9 having good etching resistance is provided in the invention (see FIG. 12G).

Step of Removing the $1^{st}$ Mask and the $2^{nd}$ Mask

After the step of etching the substrate material 7 as described above, there is the step provided of removing the $1^{st}$ mask 5' and the $2^{nd}$ mask 9, ending up with the state depicted in FIG. 12G. It is thus possible to obtain the substrate 7 having the recess 19 previously formed in the pre-step and the later formed recess 11 provided in the desired pattern. It is to be noted that the recesses 19 and 11 may have the same depth or varying depths depending on the selection of the respective etching conditions. In the instant embodiment, the recesses 19 and 11 may have any separate depths because the time of etching differs.

The substrate 7 having such a desired pattern formed on it, for instance, may be applied to the production of electronic parts equipped with semiconductor integrated circuits or high-density recording media.

It is to be noted that in the fourth embodiment as described above, there is an additional step of sealing only an area, where there is the difficult-to-access recess formed in the pre-step, with a sealing material.

In order for the sealing material not to enter the easy-to-access recess that is not to be sealed, it is necessary to previously learn the size of a minimum sealing area to be formed by the sealing material, and with this minimum sealing area in mind, it is desired to determine the locations of an area where the difficult-to-access recess is present and an area where the easy-to-access recess is present.

For instance, when there is the easy-to-access recess located substantially in opposition to the difficult-to-access recess with a space between them, areas each having the easy-to-access recess should be located at a given certain space in connection with the minimum sealing area to be sealed with the sealing material. The given space between the areas each having the easy-to-access recess is explained with reference to FIG. 13 here on the presumption that the minimum sealing area capable of being sealed with the sealing material takes the form of a circle.

Figure 13:
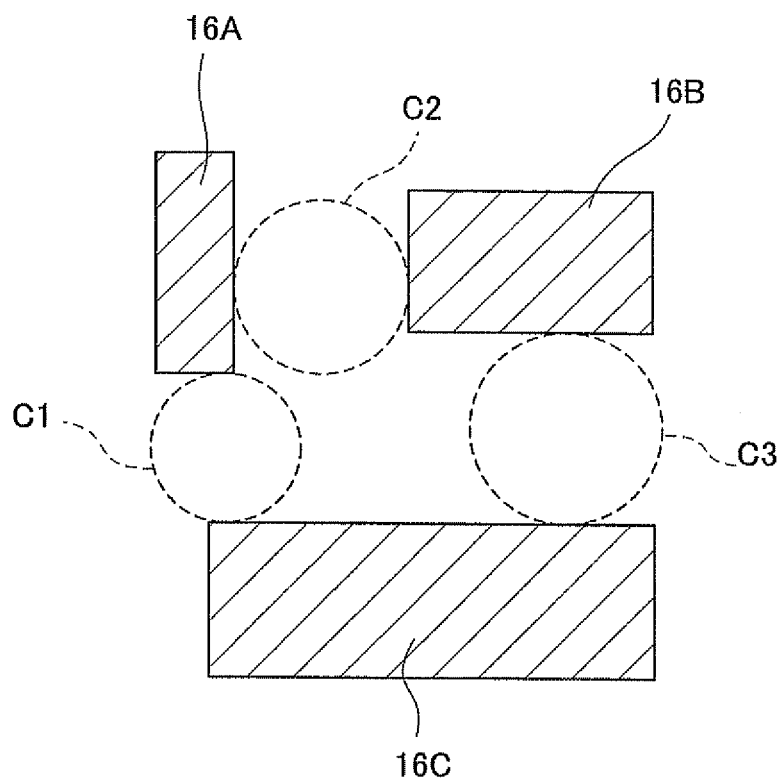
FIG. 13 is a plan view illustrative of what relation the space for locating the difficult-to-access recess has to the area for forming the easy-to-access recess in the pattern-formation process depicted in FIGS. 11 and 12.

FIG. 13 illustrates that three areas 16A, 16B and 16C, each having the easy-to-access recess, are located at given spaces. Suppose here that areas between three areas 16A, 16B and 16C each have an area where there is the difficult-to-access recess present. In order for the sealing material to sit in only the areas each having the difficult-to-access recess without being in touch with three areas 16A, 16B and 16C, the diameters of circles C1, C2 and C3 (three circles indicated by dotted lines) in circumscription with the areas 16A, 16B and 16C each having the difficult-to-access recess may be designed to be larger than that of the minimum sealing area capable of being sealed with the sealing material, as shown. One exemplary figure specific about such spaces may be 25 μm or more.

The reason is that given an area defined by a circle having a diameter of 25 μm or more, even when there is the difficult-to-access recess present in that area, it is possible to provide the sealing material in only the area having the difficult-to-access recess typically in the inkjet mode, without having adverse influences on the easy-to-access recess. It is to be noted that the figure of 25 μm is provided just by way of example but not by way of limitation, because the minimum diameter of droplets in the inkjet mode may be variable with the wettability of substrates, the types of sealing materials (resins), the performance of inkjet apparatuses, etc. Sealing may also be implemented in other modes than the inkjet mode.

EXAMPLES

The present invention will now be explained in greater details with reference to specific examples.

Example I-1

The pattern-formation process using the nanoimprint method was carried out in such manners as depicted in FIGS. 1 and 2.

The mold used was made of quartz glass having a surface size of 40×40 mm and a thickness of 6.35 mm. The quartz glass was provided on its substantially central portion with a line-and-space pattern which had a pattern depth of 25 nm and a pattern length of 2 mm with 200 repetitions of a line width (width of the flat portion)/space (width of the recess) of 16 nm/24 nm.

The mold was also coated on its surface with a releasing agent Optool DSX (made by Daikin Industries Ltd.).

For the substrate material for imprinting, a quartz substrate of 6 inches in diameter was used.

The photocurable resin material of the composition mentioned below, in droplet form, was dropped onto the surface of the substrate material for imprinting: it was dropped onto an area of that surface larger than a recess-and-projection structure pattern of the mold at a given pitch and in such a way as to substantially correspond to the surface of the mold having that recess-and-projection structure pattern and create a rectangular resin layer form. The dropwise application of the resin material was carried out using an inkjet apparatus.

Composition of the Photocurable Resin Material

| Isobornyl Acrylate | 38% by weight |
| Ethylene Glycol Diacrylate | 20% by weight |
| Butyl Acrylate | 38% by weight |
| 2-Hydroxy-2-Methyl-1-Phenyl-Propan-1-One | 2% by weight |
| 2-Perfluorodecylethyl Acrylate | 1% by weight |
| Methylperfluorooctanolate | 1% by weight |

The mold having the recess-and-projection structure pattern was allowed to draw to the substrate for imprinting, to which the resin material was fed as mentioned above.

In this state, the mold side was irradiated with parallel light (ultraviolet radiation having a peak wavelength of 365 nm) from an illumination optical system of the imprint apparatus under a condition of 100 mJ/cm$^2$, so that the photocurable resin material was cured into a resin layer having a rectangular form.

Then, the peeling step of pulling the mold off the resin layer was done to form a line-and-space pattern on the 6-inch quartz substrate, thereby completing the step of providing the substrate material having the recesses formed by the presence of the 1$^{st}$ mask comprising the resin layer. The pattern formed on the substrate had a pitch of 40 nm and the recess size Wr was 16 nm. The side of each recess had a height of 25 nm.

Then, Cr that was the 2$^{nd}$ mask-formation material was formed as a film by sputtering vertically to the major surface of the substrate having the 1$^{st}$ mask formed on it, depositing the 2$^{nd}$ mask-formation material all over the upper surface of the 1$^{st}$ mask and peripherally on the side of the recess thereby forming the 2$^{nd}$ mask comprising a series of films.

Then, CF$_4$ was used as an etching gas to etch the quartz substrate positioned at the bottom of the recess down to a depth of 15 nm.

Thereafter, the 2$^{nd}$ mask made of Cr and the 1$^{st}$ mask made of the resin layer, both remaining on the quartz substrate, were etched off, so that there could be a substrate obtained that had a line-and-space in which an elongated groove form of recesses of 15 nm in depth, 16 nm in width and 2 mm in length were located at a 40 nm pitch.

It is to be noted that the deposition of the 2$^{nd}$ mask-formation material not only all over the upper surface of the 1$^{st}$ mask but also peripherally on the side of the recess was identified from the fact that size changes relative to the size of the mask pattern were found to be very little through SEM observations of sections of the etching shape of the etched quartz substrate.

It is also to be noted that the 2$^{nd}$ mask-formation material not reaching down to the bottom of the recess was identified from the fact that the quartz substrate positioned at the bottom of the recess could be etched directly to a depth of 15 nm, using CF$_4$ as an etching gas.

Example I-2

The pattern-formation process using the nanoimprint method was carried out in such manners as depicted in FIGS. 1 and 2.

The mold used was made of quartz glass having a surface size of 40×40 mm and a thickness of 6.35 mm. The quartz glass was provided on its substantially central portion with a line-and-space pattern which had a pattern depth of 25 nm and a pattern length of 2 mm with 200 repetitions of a line width/space of 20 nm/20 nm.

The step of providing a substrate material having a recess formed by the presence of the 1$^{st}$ mask comprising a resin layer was completed by using this mold to form a line-and-space pattern on the 6-inch quartz substrate by a nanoimprint method similar to that used in Example I-1. The pattern formed on the substrate had a pitch of 40 nm and the recess size Wr was 16 nm. The side of each recess had a height of 25 nm.

Then, Cr that was the 2$^{nd}$ mask-formation material was formed as a film by sputtering vertically to the major surface of the substrate having the 1$^{st}$ mask formed on it, depositing the 2$^{nd}$ mask-formation material all over the upper surface of the 1$^{st}$ mask and peripherally on the side of the recess thereby forming the 2$^{nd}$ mask comprising a series of films.

Then, CF$_4$ was used as an etching gas to etch the quartz substrate positioned at the bottom of the recess down to a depth of 15 nm.

Thereafter, the 2$^{nd}$ mask made of Cr and the 1$^{st}$ mask made of the resin layer, both remaining on the quartz substrate, were etched off, so that there could be a substrate obtained that had a line-and-space in which an elongated groove form of recesses of 15 nm in depth, 20 nm in width and 2 mm in length were located at a 40 nm pitch.

It is to be noted that the deposition of the $2^{nd}$ mask-formation material not only all over the upper surface of the $1^{st}$ mask but also peripherally on the side of the recess was identified from the fact that size changes relative to the size of the mask pattern were found to be very little through SEM observations of sections of the etching shape of the etched quartz substrate.

It is also to be noted that the $2^{nd}$ mask-formation material not reaching down to the bottom of the recess was identified from the fact that the quartz substrate positioned at the bottom of the recess could be etched directly to a depth of 15 nm, using $CF_4$ as an etching gas.

Example I-3

The pattern-formation process using the nanoimprint method was carried out in such manners as depicted in FIGS. 1 and 2.

The mold used was made of quartz glass having a surface size of 40×40 mm and a thickness of 6.35 mm. The quartz glass was provided on its substantially central portion with a line-and-space pattern which had a pattern depth of 25 nm and a pattern length of 2 mm with 200 repetitions of a line width/space of 25 nm/25 nm.

The step of providing a substrate material having a recess formed by the presence of the $1^{st}$ mask comprising a resin layer was completed by using this mold to form a line-and-space pattern on the 6-inch quartz substrate by a nanoimprint method similar to that used in Example I-1. The pattern formed on the substrate had a pitch of 50 nm and the recess size Wr was 25 nm. The side of each recess had a height of 25 nm.

Then, Cr that was the $2^{nd}$ mask-formation material was formed as a film by sputtering vertically to the major surface of the substrate having the $1^{st}$ mask formed on it, depositing the $2^{nd}$ mask-formation material all over the upper surface of the $1^{st}$ mask and peripherally on the side of the recess thereby forming the $2^{nd}$ mask comprising a series of films.

Then, $CF_4$ was used as an etching gas to etch the quartz substrate positioned at the bottom of the recess down to a depth of 15 nm.

Thereafter, the $2^{nd}$ mask made of Cr and the $1^{st}$ mask made of the resin layer, both remaining on the quartz substrate, were etched off, so that there could be a substrate obtained that had a line-and-space in which an elongated groove form of recesses of 15 nm in depth, 25 nm in width and 2 mm in length were located at a 50 nm pitch.

It is to be noted that the deposition of the $2^{nd}$ mask-formation material not only all over the upper surface of the $1^{st}$ mask but also peripherally on the side of the recess was identified from the fact that size changes relative to the size of the mask pattern were found to be very little through SEM observations of sections of the etching shape of the etched quartz substrate.

It is also to be noted that the $2^{nd}$ mask-formation material not reaching down the bottom of the recess was identified from the fact that the quartz substrate positioned at the bottom of the recess could be etched directly to a depth of 15 nm, using $CF_4$ as an etching gas.

Comparative Example I-1

The pattern-formation process using the nanoimprint method was carried out in such manners as depicted in FIGS. 1 and 2.

The mold used was made of quartz glass having a surface size of 40×40 mm and a thickness of 6.35 mm. The quartz glass was provided on its substantially central portion with a line-and-space pattern which had a pattern depth of 25 nm and a pattern length of 2 mm with 200 repetitions of a line width/space of 30 nm/30 nm.

The step of providing a substrate material having a recess formed by the presence of the $1^{st}$ mask was completed by using this mold to form a line-and-space pattern on the 6-inch quartz substrate by a nanoimprint method similar to that used in Example I-1. The pattern formed on the substrate had a pitch of 60 nm and the recess size Wr was 30 nm. The side of each recess had a height of 25 nm.

Then, Cr that was the $2^{nd}$ mask-formation material was formed as a film by sputtering vertically to the major surface of the substrate having the $1^{st}$ mask formed on it, depositing the $2^{nd}$ mask-formation material all over the upper surface of the $1^{st}$ mask and peripherally on the side of the recess thereby forming the $2^{nd}$ mask comprising a series of films.

Then, there was an attempt made to etch the quartz substrate positioned at the bottom of the recess using $CF_4$ as an etching gas, but that failed because Cr that was the $2^{nd}$ mask-formation material was deposited in film form at the bottom of the recess. It is to be noted that even when samples having the $2^{nd}$ masks in varied thicknesses were prepared by varying the film-formation time of the $2^{nd}$ mask-formation material, it was still impossible to implement etching down to the desired target depth.

Example II-1

The pattern-formation process using the nanoimprint method was carried out in such manners as depicted in FIGS. 1 and 2.

The mold used was made of quartz glass having a surface size of 40×40 mm and a thickness of 6.35 mm. The quartz glass was provided on its substantially central portion with a line-and-space pattern which had a pattern depth of 25 nm and a pattern length of 2 mm with 200 repetitions of a line width (width of the flat portion)/space (width of the recess) of 16 nm/24 nm.

The mold was also coated on its surface with a releasing agent Optool DSX (made by Daikin Industries Ltd.).

For the substrate material for imprinting, a Si substrate of 6 inches in diameter was used.

The photocurable resin material of the composition mentioned below, in droplet form, was dropped onto the surface of the substrate material for imprinting: it was dropped onto an area of that surface larger than a recess-and-projection structure pattern of the mold at a given pitch and in such a way as to substantially correspond to the surface of the mold having that recess-and-projection structure pattern and create a rectangular resin layer form. The dropwise application of the resin material was carried out using an inkjet apparatus.

Composition of the Photocurable Resin Material

| | |
|---|---|
| Isobornyl Acrylate | 38% by weight |
| Ethylene Glycol Diacrylate | 20% by weight |
| Butyl Acrylate | 38% by weight |
| 2-Hydroxy-2-Methyl-1-Phenyl-Propan-1-One | 2% by weight |
| 2-Perfluorodecylethyl Acrylate | 1% by weight |
| Methylperfluorooctanolate | 1% by weight |

The mold having the recess-and-projection structure pattern was allowed to draw to the substrate for imprinting, to which the resin material was fed as mentioned above.

In this state, the mold side was irradiated with parallel light (ultraviolet radiation having a peak wavelength of 365 nm) from an illumination optical system of the imprint apparatus under a condition of 100 mJ/cm$^2$, so that the photocurable resin material was cured into a resin layer having a rectangular form.

Then, the peeling step of pulling the mold off the resin layer was done to form a line-and-space pattern on the 6-inch Si substrate, thereby completing the step of providing the substrate material having the recesses formed by the presence of the 1$^{st}$ mask comprising the resin layer. The pattern formed on the substrate had a pitch of 40 nm and the recess size Wr was 16 nm. The side of each recess had a height of 25 nm.

Then, SiO$_2$ that was the 2$^{nd}$ mask-formation material was formed as a film by sputtering vertically to the major surface of the substrate having the 1$^{st}$ mask formed on it, depositing the 2$^{nd}$ mask-formation material all over the upper surface of the 1$^{st}$ mask and peripherally on the side of the recess thereby forming the 2$^{nd}$ mask comprising a series of films.

Then, HBr was used as an etching gas to etch the Si substrate positioned at the bottom of the recess down to a depth of 15 nm.

Thereafter, the 2$^{nd}$ mask made of SiO$_2$ and the 1$^{st}$ mask made of the resin layer, both remaining on the Si substrate, were etched off, so that there could be a substrate obtained that had a line-and-space in which an elongated groove form of recesses of 15 nm in depth, 16 nm in width and 2 mm in length were located at a 40 nm pitch.

It is to be noted that the deposition of the 2$^{nd}$ mask-formation material not only all over the upper surface of the 1$^{st}$ mask but also peripherally on the side of the recess was identified from the fact that size changes relative to the size of the mask pattern were found to be very little through SEM observations of sections of the etching shape of the etched Si substrate.

It is also to be noted that the 2$^{nd}$ mask-formation material not reaching down the bottom of the recess was identified from the fact that the Si substrate positioned at the bottom of the recess could be etched directly to a depth of 15 nm, using HBr as an etching gas.

Example II-2

The pattern-formation process using the nanoimprint method was carried out in such manners as depicted in FIGS. 1 and 2.

The mold used was made of quartz glass having a surface size of 40×40 mm and a thickness of 6.35 mm. The quartz glass was provided on its substantially central portion with a line-and-space pattern which had a pattern depth of 25 nm and a pattern length of 2 mm with 200 repetitions of a line width/space of 20 nm/20 nm.

The step of providing a substrate material having a recess formed by the presence of the 1$^{st}$ mask comprising a resin layer was completed by using this mold to form a line-and-space pattern on the 6-inch Si substrate by a nanoimprint method similar to that used in Example II-1. The pattern formed on the substrate had a pitch of 40 nm and the recess size Wr was 20 nm. The side of each recess had a height of 25 nm.

Then, SiO$_2$ that was the 2$^{nd}$ mask-formation material was formed as a film by sputtering vertically to the major surface of the substrate having the 1$^{st}$ mask formed on it, depositing the 2$^{nd}$ mask-formation material all over the upper surface of the 1$^{st}$ mask and peripherally on the side of the recess thereby forming the 2$^{nd}$ mask comprising a series of films.

Then, HBr was used as an etching gas to etch the Si substrate positioned at the bottom of the recess down to a depth of 15 nm.

Thereafter, the 2$^{nd}$ mask made of SiO$_2$ and the 1$^{st}$ mask made of the resin layer, both remaining on the Si substrate, were etched off, so that there could be a substrate obtained that had a line-and-space in which an elongated groove form of recesses of 15 nm in depth, 20 nm in width and 2 mm in length were located at a 40 nm pitch.

It is to be noted that the deposition of the 2$^{nd}$ mask-formation material not only all over the upper surface of the 1$^{st}$ mask but also peripherally on the side of the recess was identified from the fact that size changes relative to the size of the mask pattern were found to be very little through SEM observations of sections of the etching shape of the etched Si substrate.

It is also to be noted that the 2$^{nd}$ mask-formation material not reaching down the bottom of the recess was identified from the fact that the Si substrate positioned at the bottom of the recess could be etched directly to a depth of 15 nm, using HBr as an etching gas.

Example II-3

The pattern-formation process using the nanoimprint method was carried out in such manners as depicted in FIGS. 1 and 2.

The mold used was made of quartz glass having a surface size of 40×40 mm and a thickness of 6.35 mm. The quartz glass was provided on its substantially central portion with a line-and-space pattern which had a pattern depth of 25 nm and a pattern length of 2 mm with 200 repetitions of a line width/space of 25 nm/25 nm.

The step of providing a substrate material having a recess formed by the presence of the 1$^{st}$ mask comprising a resin layer was completed by using this mold to form a line-and-space pattern on the 6-inch Si substrate by a nanoimprint method similar to that used in Example II-1. The pattern formed on the substrate had a pitch of 50 nm and the recess size Wr was 25 nm. The side of each recess had a height of 25 nm.

Then, SiO$_2$ that was the 2$^{nd}$ mask-formation material was formed as a film by sputtering vertically to the major surface of the substrate having the 1$^{st}$ mask formed on it, depositing the 2$^{nd}$ mask-formation material all over the upper surface of the 1$^{st}$ mask and peripherally on the side of the recess thereby forming the 2$^{nd}$ mask comprising a series of films.

Then, HBr was used as an etching gas to etch the Si substrate positioned at the bottom of the recess down to a depth of 15 nm.

Thereafter, the 2$^{nd}$ mask made of SiO$_2$ and the 1$^{st}$ mask made of the resin layer, both remaining on the Si substrate, were etched off, so that there could be a substrate obtained that had a line-and-space in which an elongated groove form of recesses of 15 nm in depth, 25 nm in width and 2 mm in length were located at a 50 nm pitch.

It is to be noted that the deposition of the 2$^{nd}$ mask-formation material not only all over the upper surface of the 1$^{st}$ mask but also peripherally on the side of the recess was identified from the fact that size changes relative to the size of the mask pattern were found to be very little through SEM observations of sections of the etching shape of the etched Si substrate.

It is also to be noted that the 2$^{nd}$ mask-formation material not reaching down the bottom of the recess was identified from the fact that the Si substrate positioned at the bottom of the recess could be etched directly to a depth of 15 nm, using HBr as an etching gas.

Comparative Example II-1

The pattern-formation process using the nanoimprint method was carried out in such manners as depicted in FIGS. 1 and 2.

The mold used was made of quartz glass having a surface size of 40×40 mm and a thickness of 6.35 mm. The quartz glass was provided on its substantially central portion with a line-and-space pattern which had a pattern depth of 25 nm and a pattern length of 2 mm with 200 repetitions of a line width/space of 30 nm/30 nm.

The step of providing a substrate material having a recess formed by the presence of the $1^{st}$ mask comprising a resin layer was completed by using this mold to form a line-and-space pattern on the 6-inch Si substrate by a nanoimprint method similar to that used in Example II-1. The pattern formed on the substrate had a pitch of 60 nm and the recess size Wr was 30 nm. The side of each recess had a height of 25 nm.

Then, $SiO_2$ that was the $2^{nd}$ mask-formation material was formed as a film by sputtering vertically to the major surface of the substrate having the $1^{st}$ mask formed on it, depositing the $2^{nd}$ mask-formation material all over the upper surface of the $1^{st}$ mask and peripherally on the side of the recess thereby forming the $2^{nd}$ mask comprising a series of films.

Then, there was an attempt made to etch the Si substrate positioned at the bottom of the recess using HBr as an etching gas, but that failed because $SiO_2$ that was the $2^{nd}$ mask-formation material was deposited in film form at the bottom of the recess. It is to be noted that even when samples having the $2^{nd}$ masks in varied thicknesses were prepared by varying the film-formation time of the $2^{nd}$ mask-formation material, it was still impossible to implement etching down to the desired target depth.

Example III-1

There was the pattern-formation process implemented by the self-organization method of polystyrene (PS)-polydimethylsiloxane (PDMS) block copolymers in such manners as depicted in FIG. 7.

A coating composition having a polystyrene (PS)-polydimethylsiloxane (PDMS) block copolymer dissolved in a solvent was provided as a coating polymer solution.

The coating composition was applied by spin coating onto a 6-inch quartz substrate, after which annealing was performed, yielding a structure separated into the first polymer phase 21 that was composed mainly of polydimethylsiloxane (PDMS) and had etching resistance, and the second polymer phase 25 that was composed mainly of polystyrene (PS) and had lower etching resistance than that of the first polymer phase 21. The first polymer phases 21, each in a substantially spherical shape, were closest-packed (at a regular triangle pitch) on the plane of the 6-inch quartz substrate at a given pitch.

Then, the composition layer separated into double phases on the substrate material 7 was treated by reactive etching (RIE) thereby forming the bowl-like $1^{st}$ mask 30 on the substrate material 7, which mask was patterned in such a way as to provide a closest-pack arrangement (regular triangle pitch arrangement) with the position of presence of the first polymer phase 21 as center (see the patterns shown in FIGS. 7B and 4). The pitch of the recess-and-projection pattern observed in the state shown in FIG. 4 was about 30 nm, and the recess size Wr was Wr=d≈15 nm. The height of the side of the recess was 12 nm.

Then, Cr that was the $2^{nd}$ mask-formation material was formed as a film by sputtering vertically to the major surface of the substrate having the $1^{st}$ mask formed on it, depositing the $2^{nd}$ mask-formation material all over the upper surface of the $1^{st}$ mask and peripherally on the side of the recess thereby forming the $2^{nd}$ mask comprising a series of films (see FIG. 7C).

Then, $CF_4$ was used as an etching gas to etch the quartz substrate positioned at the bottom of the recess down to a depth of 15 nm (see FIG. 7D).

Thereafter, the $2^{nd}$ mask and the $1^{st}$ mask, both remaining on the quartz substrate, were etched off, so that there could be a substrate obtained in which the recesses remained in an islands configuration at a pitch of about 30 nm corresponding to the mask arrangement.

It is to be noted that the deposition of the $2^{nd}$ mask-formation material not only all over the upper surface of the $1^{st}$ mask but also peripherally on the side of the recess was identified from the fact that size changes relative to the size of the mask pattern were found to be very little through SEM observations of sections of the etching shape of the etched quartz substrate.

It is also to be noted that the $2^{nd}$ mask-formation material not reaching down the bottom of the recess was identified from the fact that the quartz substrate positioned at the bottom of the recess could be etched directly down to a depth of 15 nm, using $CF_4$ as an etching gas.

Example III-2

The pattern-formation process was carried out by the self-organization method of polystyrene (PS)-polydimethylsiloxane (PDMS) block copolymers in the manner depicted in FIG. 7.

The molecular weight of the block copolymer used was varied from that in Example III-1: the molecular weights of polystyrene (PS) and polydimethylsiloxane (PDMS) were lower. As a result, there were such changes in the $1^{st}$ mask pattern formed on the substrate as described below. That is, the pitch of the recess-and-projection pattern observed in the state depicted in FIG. 4 was about 17 nm and the recess size Wr was Wr=d≈8 nm. The height of the side of the recess was 12 nm.

Then, Cr that was the $2^{nd}$ mask-formation material was formed as a film by sputtering vertically to the major surface of the substrate having the $1^{st}$ mask formed on it, depositing the $2^{nd}$ mask-formation material all over the upper surface of the $1^{st}$ mask and peripherally on the side of the recess thereby forming the $2^{nd}$ mask comprising a series of films (see FIG. 7C).

Then, $CF_4$ was used as an etching gas to etch the quartz substrate positioned at the bottom of the recess down to a depth of 15 nm (see FIG. 7D).

Thereafter, the $2^{nd}$ mask and the $1^{st}$ mask, both remaining on the quartz substrate, were etched off, so that there could be a substrate obtained in which the recesses remained in an islands configuration at a pitch of about 17 nm corresponding to the mask arrangement.

It is to be noted that the deposition of the $2^{nd}$ mask-formation material not only all over the upper surface of the $1^{st}$ mask but also peripherally on the side of the recess was identified from the fact that size changes relative to the size of the mask pattern were found to be very little through SEM observations of sections of the etching shape of the etched quartz substrate.

It is also to be noted that the $2^{nd}$ mask-formation material not reaching down the bottom of the recess was identified from the fact that the quartz substrate positioned at the bottom of the recess could be etched directly down to a depth of 15 nm, using $CF_4$ as an etching gas.

Comparative Example III-1

The pattern-formation process was carried out by the self-organization method of polystyrene (PS)-poly-dimethylsiloxane (PDMS) block copolymers in the manner depicted in FIG. 7.

The molecular weight of the block copolymer used was varied from that in Example III-1: the molecular weights of polystyrene (PS) and polydimethylsiloxane (PDMS) were a lot more. As a result, there were such changes in the $1^{st}$ mask pattern formed on the substrate as mentioned just below. That is, the pitch of the recess-and-projection pattern observed in the state depicted in FIG. 4 was about 60 nm and the recess size Wr was Wr=d≈30 nm. The height of the side of the recess was 25 nm.

Then, Cr that was the $2^{nd}$ mask-formation material was formed as a film by sputtering vertically to the major surface of the substrate having the $1^{st}$ mask formed on it, depositing the $2^{nd}$ mask-formation material all over the upper surface of the $1^{st}$ mask and peripherally on the side of the recess thereby forming the $2^{nd}$ mask comprising a series of films (see FIG. 7C).

Then, there was an attempt made to etch the quartz substrate positioned at the bottom of the recess using $CF_4$ as an etching gas, but that failed because Cr that was the $2^{nd}$ mask-formation material was deposited in film form at the bottom of the recess. It is to be noted that even when samples having the $2^{nd}$ masks in varied thicknesses were prepared by varying the film-formation time of the $2^{nd}$ mask-formation material, it was still impossible to implement etching down to the desired target depth.

Example IV

The pattern-formation process using the nanoimprint method was carried out in such manners as depicted in FIGS. 9 and 10.

The mold used was made of quartz glass having a surface size of 40×40 mm and a thickness of 6.35 mm. The quartz glass was provided on its substantially central portion with a line-and-space pattern which had a pattern depth of 25 nm and a pattern length of 2 mm with 200 repetitions of a line width (width of the projection)/space (width of the recess) of 16 nm/24 nm. Further, the mold used was provided at four corners of the quartz glass (four sites ±15 mm, ±15 mm away from the center) with a crisscross pattern of 100 μm×100 μm as the recess-and-projection structure area B2 for forming a site including easy-to-access recesses, with the width (projection width) and the depth being 1 μm and 25 nm, respectively.

The mold was coated on its surface with a releasing agent Optool DSX (made by Daikin Industries Ltd.).

For the substrate material for imprinting, a quartz substrate of 6 inches in diameter was used.

The photocurable resin material of the composition mentioned below, in droplet form, was dropped onto the surface of the substrate material for imprinting: it was dropped onto an area of that surface larger than a recess-and-projection structure pattern of the mold comprising the recess-and-projection structure area B1 for forming a site including difficult-to-access recesses and the recess-and-projection structure area B2 for forming a site including easy-to-access recesses in such a way as to substantially correspond to the surface of the mold having that recess-and-projection structure pattern and create a rectangular resin layer form. The dropwise application of the resin material was carried out using an inkjet apparatus.

Composition of the Photocurable Resin Material

| Isobornyl Acrylate | 38% by weight |
| Ethylene Glycol Diacrylate | 20% by weight |
| Butyl Acrylate | 38% by weight |
| 2-Hydroxy-2-Methyl-1-Phenyl-Propan-1-One | 2% by weight |
| 2-Perfluorodecylethyl Acrylate | 1% by weight |
| Methylperfluorooctanolate | 1% by weight |

The mold having the recess-and-projection structure pattern was allowed to draw to the substrate for imprinting, to which the resin material was fed as mentioned above.

In this state, the mold side was irradiated with parallel light (ultraviolet radiation having a peak wavelength of 365 nm) from an illumination optical system of the imprint apparatus under a condition of 100 mJ/cm², so that the photocurable resin material was cured into a resin layer having a rectangular form.

Then, the peeling step of pulling the mold off the resin layer was done to form a line-and-space pattern (difficult-to-access recesses) at a central portion on the 6-inch quartz substrate and crisscross recesses (easy-to-access recesses) at the four corners, thereby completing the step of providing the substrate material having the recesses formed by the presence of the $1^{st}$ mask comprising the resin layer. The pattern formed at the central portion of the substrate had a pitch of 40 nm and the recess (difficult-to-access recess) size Wr was 16 nm. The side of each recess had a height of 25 nm, and the crisscross recesses (easy-to-access recesses) formed at the four corners of the substrate each had a size We of 1 μm.

Then, Cr that was the $2^{nd}$ mask-formation material was formed as a film by sputtering vertically to the major surface of the substrate having the $1^{st}$ mask formed on it, depositing the $2^{nd}$ mask-formation material all over the upper surface of the $1^{st}$ mask and peripherally on the side of the recess thereby forming the $2^{nd}$ mask comprising a series of films. In the instant embodiment wherein there were the difficult-to-access recess 6 plus the easy-to-access recess 16, the $2^{nd}$ mask-formation material was deposited on the bottom of that easy-to-access recess 16, providing a bottom deposition layer 9'. In addition, the $2^{nd}$ mask-formation material was deposited on the side of the easy-to-access recess 16 too, forming a side layer.

Then, reactive ion etching using $Cl_2$ gas was implemented for removal of the bottom deposition layer 9' comprising the $2^{nd}$ mask-formation material being deposited at the bottom of the easy-to-access recess 16, and the side layer of the easy-to-access recess 16.

Then, $CF_4$ gas was used as an etching gas to etch the quartz substrate positioned at the bottoms of the difficult-to-access recess 6 and easy-to-access recess 16 down to a depth of 15 nm.

Thereafter, the $2^{nd}$ mask made of Cr and the $1^{st}$ mask made of the resin layer, both remaining on the quartz substrate, were etched off by asking using $O_2$ plasma, so that there could be a substrate obtained that had on the central portion a line-and-space in which an elongated groove form of recesses of 15 nm in depth, 16 nm in width and 2 mm in length were located at a 40 nm pitch, and crisscross recesses of 15 nm in depth and 1 μm in width were located at the four corners.

It is to be noted that the deposition of the $2^{nd}$ mask-formation material not only all over the upper surface of the $1^{st}$ mask but also peripherally on the side of the difficult-to-access recess was identified from the fact that size changes relative to the size of the mask pattern were found to be very little through SEM observations of sections of the etching shape of the etched quartz substrate.

It is also to be noted that the $2^{nd}$ mask-formation material not substantially reaching down to the bottom of the difficult-to-access recess was identified from the fact that the quartz substrate positioned at the bottom of the recess could be etched directly to a depth of 15 nm, using $CF_4$ as an etching gas.

Example V

The pattern-formation process using the nanoimprint method was carried out in such manners as depicted in FIGS. 11 and 12.

The mold used was made of quartz glass having a surface size of 40×40 mm and a thickness of 6.35 mm. The quartz glass was provided on its substantially central portion with a line-and-space pattern as the recess-and-projection structure area B1 for forming a site including difficult-to-access recesses, which pattern had a pattern depth of 25 nm and a pattern length of 2 mm with 200 repetitions of a line width (width of the projection)/space (width of the recess) of 16 nm/24 nm. Further, the mold used was provided at four corners of the quartz glass (four sites ±15 mm, ±15 mm away from the center) with a crisscross pattern of 100 μm×100 μm as the recess-and-projection structure area B2 for forming a site including easy-to-access recesses, with the width (projection width) and the depth being 1 μm and 25 nm, respectively.

The mold was coated on its surface with a releasing agent Optool DSX (made by Daikin Industries Ltd.).

For the substrate material for imprinting, a quartz substrate of 6 inches in diameter was used.

The photocurable resin material of the composition mentioned below, in droplet form, was dropped onto the surface of the substrate material for imprinting: it was dropped onto an area of that surface larger than a recess-and-projection structure pattern of the mold comprising the recess-and-projection structure area B1 for forming a site including difficult-to-access recesses and the recess-and-projection structure area B2 for forming a site including easy-to-access recesses in such a way as to substantially correspond to the surface of the mold having that recess-and-projection structure pattern and create a rectangular resin layer form. The dropwise application of the resin material was carried out using an inkjet apparatus.

Composition of the Photocurable Resin Material

| | |
|---|---|
| Isobornyl Acrylate | 38% by weight |
| Ethylene Glycol Diacrylate | 20% by weight |
| Butyl Acrylate | 38% by weight |
| 2-Hydroxy-2-Methyl-1-Phenyl-Propan-1-One | 2% by weight |
| 2-Perfluorodecylethyl Acrylate | 1% by weight |
| Methylperfluorooctanolate | 1% by weight |

The mold having the recess-and-projection structure pattern was allowed to draw to the substrate for imprinting, to which the resin material was fed as mentioned above.

In this state, the mold side was irradiated with parallel light (ultraviolet radiation having a peak wavelength of 365 nm) from an illumination optical system of the imprint apparatus under a condition of 100 mJ/cm², so that the photocurable resin material was cured into a resin layer having a rectangular form.

Then, the peeling step of pulling the mold off the resin layer was done to form a line-and-space pattern (difficult-to-access recesses) at a central portion on the 6-inch quartz substrate and crisscross recesses (easy-to-access recesses) at the four corners, thereby completing the step of providing the substrate material having the difficult-to-access and easy-to-access recesses formed by the presence of the $1^{st}$ mask comprising the resin layer. The pattern formed at the central portion of the substrate had a pitch of 40 nm and the recess (difficult-to-access recess) size Wr was 16 nm. The side of each recess had a height of 25 nm, and the crisscross recesses (easy-to-access recesses) formed at the four corners of the substrate each had a size We of 1 μm.

Then, the difficult-to-access recesses were sealed up with a sealing material. More specifically, the aforesaid resin material (the same as the $1^{st}$ mask material) in droplet form was dropped onto the pattern area corresponding to the difficult-to-access recesses in the inkjet mode, and then cured to cover them with the resin layer for sealing.

Then, a portion of the quartz substrate corresponding to the easy-to-access recesses 16 was etched down to a depth of 15 nm via the $1^{st}$ mask including the resin layer that was the sealing material (the formation of recesses 19). The etching used was induction coupling plasma (ICP) etching using $CF_4$ as an etching gas.

Then, the $1^{st}$ mask including the resin layer 59' that was the sealing material was removed by aching using $O_2$ plasma to form the substrate material 7 having recesses 19.

Then, the step of providing a substrate material having difficult-to-access recesses and easy-to-access recesses formed by the presence of the $1^{st}$ mask was carried out pursuant to an operation similar to the pre-step of providing the substrate material having difficult-to-access and easy-to-access recesses formed by the $1^{st}$ mask. That is, the photocurable resin material in droplet form was dropped onto an area larger than the recess-and-projection pattern area comprising the recess-and-projection structure area B1 for forming a site including difficult-to-access recesses and the recess-and-projection structure area B2 for forming a site including easy-to-access recesses such that there is a resin layer created on the surface of the substrate including the aforesaid recesses 19, corresponding substantially to a surface of the mold having a recess-and-projection structure pattern and in a rectangular form. The dropwise addition of the resin material was carried out using an inkjet apparatus. The photocurable resin material used was the same as the $1^{st}$ mask-formation material.

The mold having the recess-and-projection structure pattern was allowed to draw to the substrate for imprinting, to which the resin material was fed as mentioned above. Note here that there was an alignment ao operation of aligning the mold with the substrate carried out such that the difficult-to-access and easy-to-access recesses were formed by the presence of the $1^{st}$ mask in the same positions as the difficult-to-access and easy-to-access recesses formed by the presence of the $1^{st}$, mask in the pre-step. Alignment was carried out by matching the alignment marks previously formed on the mold and substrate.

In this state, the mold side was irradiated with parallel light (ultraviolet radiation having a peak wavelength of 365 nm) from an illumination optical system of the imprint apparatus under a condition of 100 mJ/cm², so that the photocurable resin material was cured into a resin layer having a rectangular form.

Then, the peeling step of pulling the mold off the resin layer was done to form a line-and-space pattern (difficult-to-access recesses) at a central portion on the 6-inch quartz substrate and crisscross recesses (easy-to-access recesses) at the four corners, thereby completing the step of providing the substrate material having the difficult-to-access and easy-to-access recesses formed by the presence of the $1^{st}$ mask comprising the resin layer. The pattern formed at the central portion of the substrate had a pitch of 40 nm and the recess (difficult-to-access recess) size Wr was 16 nm. The side of each recess had a height of 25 nm, and the crisscross recesses (easy-to-access recesses) formed at the four corners of the substrate each had a size We of 1 μm.

Then, Cr that was the $2^{nd}$ mask-formation material was formed as a film by sputtering vertically to the major surface of the substrate having the $1^{st}$ mask formed on it, depositing the $2^{nd}$ mask-formation material all over the upper surface of the $1^{st}$ mask and peripherally on the side of the recess thereby forming the $2^{nd}$ mask comprising a series of films. In the instant embodiment wherein there were the difficult-to-access recess 6 plus the easy-to-access recess 16, the $2^{nd}$ mask-formation material was deposited on the bottom of that easy-to-access recess 16, providing a bottom deposition layer 9'. Note here that the $2^{nd}$ mask-formation material was deposited on the side of the easy-to-access recess 16 too, forming a side layer.

Then, $CF_4$ gas was used as an etching gas to etch the quartz substrate positioned at the bottoms of the difficult-to-access recesses 6 down to a depth of 15 nm.

Thereafter, the $2^{nd}$ mask made of Cr and the $1^{st}$ mask made of the resin layer, both remaining on the quartz substrate, were etched off by aching using $O_2$ plasma, so that there could be a substrate obtained that had on the central portion a line-and-space in which an elongated groove form of recesses of 15 nm in depth, 16 nm in width and 2 mm in length were located at a 40 nm pitch, and crisscross recesses of 15 nm in depth and 1 μm in width were located at the four corners.

It is to be noted that the deposition of the $2^{nd}$ mask-formation material not only all over the upper surface of the $1^{st}$ mask but also peripherally on the side of the difficult-to-access recess was identified from the fact that size changes relative to the size of the mask pattern were found to be very little through SEM observations of sections of the etching shape of the etched quartz substrate.

It is also to be noted that the $2^{nd}$ mask-formation material not substantially reaching down the bottom of the difficult-to-access recess was identified from the fact that the quartz substrate positioned at the bottom of the recess could be etched directly to a depth of 15 nm, using $CF_4$ as an etching gas.

From the foregoing results, the advantages of the invention would be obvious. That is, with the inventive pattern-formation process comprising a step of providing a substrate material having on a major surface a difficult-to-access recess formed by the presence of a $1^{st}$ mask, a step of using a physical evaporation method to deposit a $2^{nd}$ mask-formation material, which is higher than said $1^{st}$ mask in terms of etching resistance, from said $1^{st}$ mask side all over the upper surface of said $1^{st}$ mask and peripherally on a side of said difficult-to-access recess to form the $2^{nd}$ mask comprising a series of films, and a step of etching said substrate material via said $1^{st}$ mask and said $2^{nd}$ mask, wherein said $2^{nd}$ mask-formation step comprises operation of flying said $2^{nd}$ mask-formation material by the physical evaporation method vertically to the major surface of said substrate material, and said difficult-to-access recess is sized such that when said $2^{nd}$ mask-formation material is flown and deposited by the physical evaporation method vertically to the major surface of said substrate material, said $2^{nd}$ mask-formation material cannot substantially reach down to the bottom of said difficult-to-access recess, it is possible to improve the resistance of the etching masks, so that portions of the difficult-to-access recesses formed by the presence of the etching masks in a site to be etched can be processed by etching even when those recesses are 25 nm or less, and especially 20 nm or less in size.

According to the invention, even when there are easy-to-access recesses that are larger in size than the difficult-to-access recesses, it is possible not only to process by etching portions of the substrate material corresponding to said easy-to-access recesses but also to process by etching portions of the substrate material corresponding to the difficult-to-access recesses.

What is claimed is:

1. A pattern-formation process, comprising: a step of providing a substrate material having on a major surface a difficult-to-access recess formed by the presence of a $1^{st}$ mask,
   a step of using a physical evaporation method to deposit a $2^{nd}$ mask-formation material, which is higher than said $1^{st}$ mask in terms of etching resistance, all over an upper surface of said $1^{st}$ mask and peripherally on a side of said difficult-to-access recess to form a $2^{nd}$ mask comprising a series of films, and
   a step of etching said substrate material via said $1^{st}$ mask and said $2^{nd}$ mask, wherein:
   said $2^{nd}$ mask-formation step comprises operation of flying said $2^{nd}$ mask-formation material by the physical evaporation method vertically, in a direction substantially perpendicular to the major surface of said substrate material, the direction substantially perpendicular being within a range of ±10° perpendicular to the major surface, towards the major surface of said substrate material, and said $2^{nd}$ mask-formation material tapering in thickness from the upper surface of said $1^{st}$ mask to the major surface of said substrate material, and
   said difficult-to-access recess is sized such that when said $2^{nd}$ mask-formation material is flown and deposited by the physical evaporation method vertically to the major surface of said substrate material, said $2^{nd}$ mask-formation material cannot substantially reach down to a bottom of said difficult-to-access recess.

2. The pattern-formation process as recited in claim 1, wherein said difficult-to-access recess has a size of 25 nm or less.

3. The pattern-formation process as recited in claim 1, wherein said difficult-to-access recess has a size of 6 to 20 nm.

4. The pattern-formation process as recited in claim 1, wherein said $2^{nd}$ mask-formation material is a metal or a semiconductor, or an oxide or nitride thereof.

5. The pattern-formation process as recited in claim 1, wherein said $1^{st}$ mask, and said difficult-to-access recess is formed by patterning of a film containing a sequenced polymer by self-organization.

6. The pattern-formation process as recited in claim 1, wherein said $1^{st}$ mask, and said difficult-to-access recess is formed by patterning using a nanoimprint mold.

7. The pattern-formation process as recited in claim 1, wherein said step of etching said substrate material is followed by a step of removing said $1^{st}$ mask and said $2^{nd}$ mask.

8. The pattern-formation process as recited in claim 1, wherein:
   in said step of providing a substrate material having on a major surface a difficult-to-access recess formed by the presence of said $1^{st}$ mask, there is an easy-to-access recess formed in addition to the difficult-to-access recess,
   in said $2^{nd}$ mask-formation step, said $2^{nd}$ mask-formation material, which is higher than said $1^{st}$ mask in terms of etching resistance, is deposited all over the upper surface of said $1^{st}$ mask and on the bottom of the easy-to-access recess, the step of etching said substrate material via said $1^{st}$ mask and said $2^{nd}$ mask is carried out via portions of said $1^{st}$ mask and said $2^{nd}$ mask remaining after removal of a bottom deposition layer deposited on the bottom of said easy-to-access recess, said $2^{nd}$ mask-formation step comprises operation of flying and depositing said $2^{nd}$ mask-formation material by the physical evaporation method vertically to the major surface of said substrate material, and said difficult-to-access recess is sized such that when said $2^{nd}$ mask-formation material is flown and deposited by the physical evaporation method vertically to the major surface of said substrate material, said $2^{nd}$ mask-formation material cannot substantially reach down to the bottom of said difficult-to-access recess.

9. The pattern-formation process as recited in claim 8, wherein said easy-to-access recess is sized such that when said $2^{nd}$ mask-formation material is flown and deposited by the physical evaporation method vertically to the major surface of said substrate material, said $2^{nd}$ mask-formation material can substantially reaches down to the bottom of said easy-to-access recess.

10. The pattern-formation process as recited in claim 1, wherein pre-steps:

a step of providing a substrate material having on a major surface a difficult-to-access recess and an easy-to-access recess formed by the presence of a $1^{st}$ mask, a step of sealing the difficult-to-access recess up with a sealing material and a step of etching said substrate material via said $1^{st}$, mask are carried out, after which the steps as recited in claim 1 are implemented, wherein:

in said step of providing a substrate material having on a major surface a difficult-to-access recess formed by the presence of said $1^{st}$ mask, there is an easy-to-access recess formed in addition to the difficult-to-access recess, in said $2^{nd}$ mask-formation step, a $2^{nd}$ mask-formation material, which is higher than said $1^{st}$ mask in terms of etching resistance, is deposited all over the upper surface of said $1^{st}$ mask and on the bottom of the easy-to-access recess, said $2^{nd}$ mask-formation step comprises operation of flying and depositing said $2^{nd}$ mask-formation material by the physical evaporation method vertically to the major surface of said substrate material, and said difficult-to-access recess is sized such that when said $2^{nd}$ mask-formation material is flown and deposited by the physical evaporation method vertically to the major surface of said substrate material, said $2^{nd}$ mask-formation material cannot substantially reach down to the bottom of said difficult-to-access recess.

11. The pattern-formation process as recited in claim 10, wherein said easy-to-access recess is sized such that when said $2^{nd}$ mask-formation material is flown and deposited by the physical evaporation method vertically to said major surface of said substrate material, said $2^{nd}$ mask-formation material can substantially reach down to the bottom of said easy-to-access recess.

12. The pattern-formation process as recited in claim 10, wherein the difficult-to-access recess and easy-to-access recess formed by the presence of said $1^{st}$ mask, and the difficult-to-access recess and easy-to-access recess formed by the presence of said $1^{st}$ mask are each formed by patterning using the same nanoimprint mold.

13. The pattern-formation process as recited in claim 10, wherein said sealing material is formed of the same material as the $1^{st}$ mask material.

* * * * *